US010056405B2

(12) United States Patent
Sunamura

(10) Patent No.: US 10,056,405 B2
(45) Date of Patent: Aug. 21, 2018

(54) SEMICONDUCTOR DEVICE AND MANUFACTURING METHOD THEREOF

(71) Applicant: Renesas Electronics Corporation, Tokyo (JP)

(72) Inventor: Hiroshi Sunamura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/253,534

(22) Filed: Aug. 31, 2016

(65) Prior Publication Data

US 2017/0098662 A1    Apr. 6, 2017

(30) Foreign Application Priority Data

Oct. 2, 2015   (JP) .................................. 2015-196659

(51) Int. Cl.
| | | |
|---|---|---|
| H01L 23/528 | (2006.01) | |
| H01L 29/786 | (2006.01) | |
| H01L 27/12 | (2006.01) | |
| H01L 23/522 | (2006.01) | |

(52) U.S. Cl.
CPC ........ H01L 27/1203 (2013.01); H01L 23/528 (2013.01); H01L 23/5226 (2013.01); *H01L 27/1225* (2013.01); *H01L 29/7869* (2013.01)

(58) Field of Classification Search
CPC ..... H01L 22/20; H01L 22/34; H01L 23/5226; H01L 23/5283; H01L 27/1203; H01L 29/7869; H01L 29/8086; H01L 23/528; H01L 27/1225
See application file for complete search history.

(56) References Cited

U.S. PATENT DOCUMENTS

| | | |
|---|---|---|
| 9,263,399 B2 | 2/2016 | Kaneko et al. |
| 2012/0126422 A1* | 5/2012 | Endo .................. H01L 23/5286 257/774 |
| 2014/0183525 A1* | 7/2014 | Kaneko ............... H01L 29/7869 257/43 |

FOREIGN PATENT DOCUMENTS

| | | |
|---|---|---|
| JP | 2003-045972 A | 2/2003 |
| WO | WO 2012/121255 A1 | 9/2012 |

* cited by examiner

*Primary Examiner* — Tom Thomas
*Assistant Examiner* — Benjamin Tzu-Hung Liu
(74) *Attorney, Agent, or Firm* — McGinn I.P. Law Group, PLLC

(57) ABSTRACT

In the case where a signal delay is found in a circuit operation in a semiconductor chip, when a repeater for delay reduction is additionally formed as a result of a design change, an increase in the area of the semiconductor chip and an increase in the manufacturing cost of a semiconductor device are prevented. The inverter forming the repeater is formed of transistors formed in the upper portion of stacked wiring layers, not transistors in the vicinity of a main surface of a semiconductor substrate. By thus implementing a design change such that the repeater is added, the number of the wiring layers which need a layout change is reduced.

3 Claims, 19 Drawing Sheets

A2

B2

C2

D2

SEMICONDUCTOR DEVICE AND MANUFACTURING METHOD THEREOF

CROSS-REFERENCE TO RELATED APPLICATIONS

The disclosure of Japanese Patent Application No. 2015-196659 filed on Oct. 2, 2015 including the specification, drawings and abstract is incorporated herein by reference in its entirety.

BACKGROUND

The present invention relates to a semiconductor device and a manufacturing method thereof, which can be used for, e.g., the manufacturing of a semiconductor device having MOSFETs in wiring layers.

There is a case where, after an LSI (Large Scale Integration) or the like is designed, a timing delay is detected in signal transmission in the chip of the LSI and redesign is required. The delay is caused by a signal flowing in a long-distance wire and is likely to occur in, e.g., a wire connecting modules such as a memory cell and a CPU (Central Processing Unit) to each other, a wire connecting memory arrays to each other, a lead-out wire from a memory array, or the like. Such a long-distance wire is formed in most cases in the upper one of a plurality of wiring layers stacked over a semiconductor substrate.

As a method of reducing a timing delay, a method has been known which inserts a repeater cell in the middle of a long-distance wire so as to divide the long-distance wire and thus corrects timing.

Patent Document 1 (International Patent Publication No. WO2012/121255) describes the formation of MOSFETs (Metal Oxide Semiconductor Field Effect Transistors) in wiring layers.

Patent Document 2 (Japanese Unexamined Patent Publication No. 2003-45972) describes the replacement of a dummy cell with a repeater cell for timing correction.

RELATED ART DOCUMENTS

Patent Documents

[Patent Document 1] International Patent Publication No. WO2012/121255
[Patent Document 2] Japanese Unexamined Patent Publication 2003-45972

SUMMARY

In the case of performing timing correction for a signal, it can be considered to change the design of a semiconductor device and newly provide the MOSFET included in a repeater cell in the vicinity of the main surface of a semiconductor substrate, similarly to another MOSFET included in, e.g., a memory cell or the like. In this case, the need arises to correct the layout of the elements formed in the vicinity of the main surface of the semiconductor substrate and the layout of long-distance wires. In addition, the need also arises to change the layout of the wires, vias (plugs), and the like included in a plurality of stacked wiring layers between the elements and the long-distance wires. This increases the manufacturing cost of the semiconductor device.

In the case of inserting (coupling) a repeater cell in the middle of a long-distance wire coupling memory arrays at a plurality of locations to each other, when the MOSFETs included in the repeater cell are to be newly provided in the vicinity of the main surface of the semiconductor substrate, it is necessary to ensure a region where the MOSFETs are to be provided between the adjacent memory arrays. In this case, the density of the memory cells included in the memory arrays per unit area decreases and therefore it is difficult to miniaturize the semiconductor device.

Other problems and novel features of the present invention will become apparent from a statement in the present specification and the accompanying drawings.

The following is a brief description of the outline of the representative ones of the embodiments disclosed in the present application.

In a semiconductor device as an embodiment, a repeater connected to a long-distance wire and used to reduce a delay is formed of transistors formed in an upper portion of stacked wiring layers.

Also, in a method of manufacturing the semiconductor device as the embodiment, a repeater formed to reduce a delay is formed of the transistors formed in the upper portion of the stacked wiring layers.

According to the embodiment, the performance of the semiconductor device can be corrected.

Also, according to another embodiment, the manufacturing cost of the semiconductor device can be reduced.

DETAILED DESCRIPTION

Figure 1:
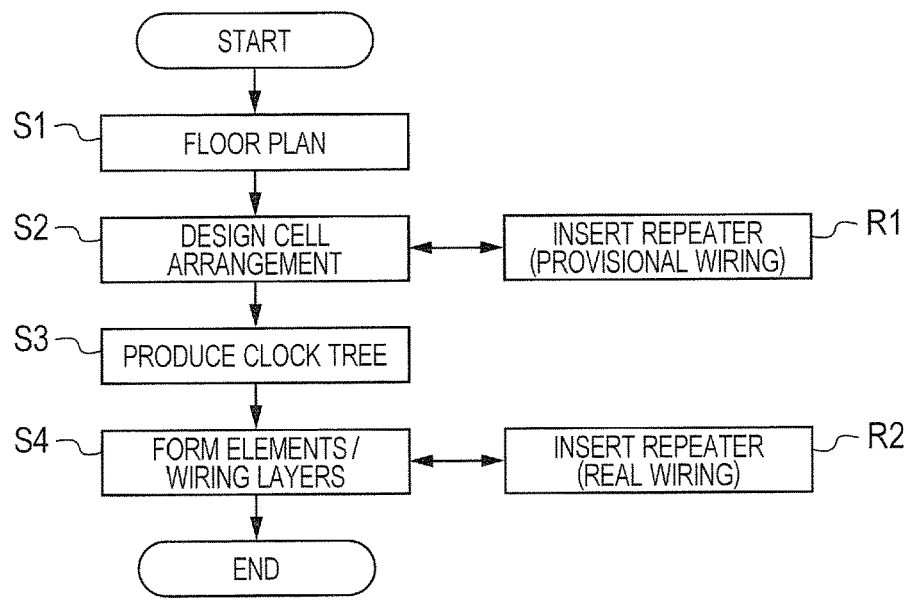
FIG. 1 is a flow chart of a semiconductor device in Embodiment 1 of the present invention.

The following will describe embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

Embodiment 1

Figure 2:
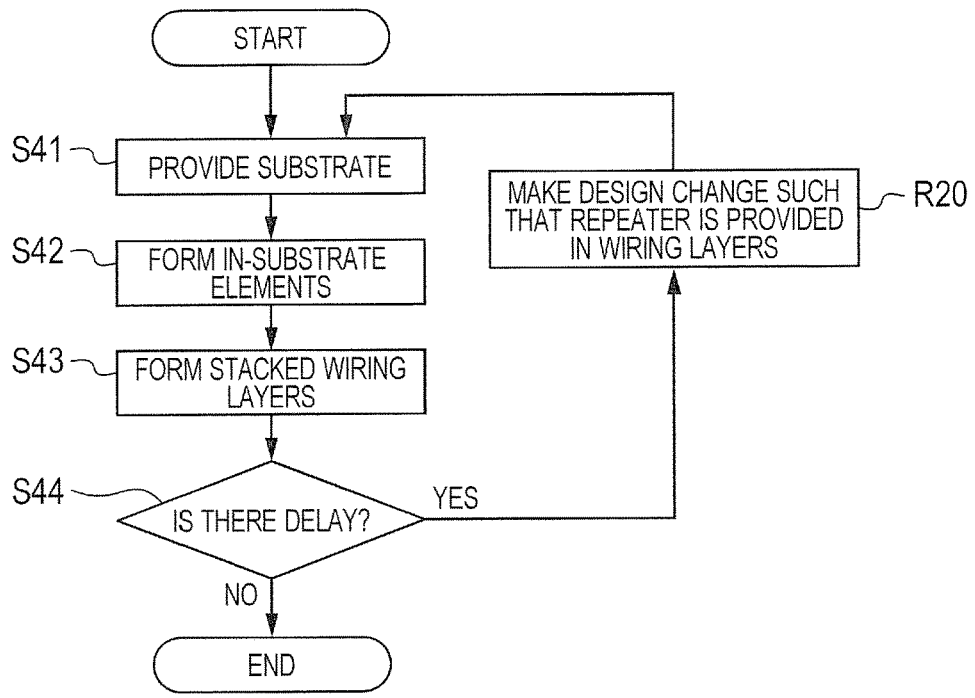
FIG. 2 is a flow chart of the semiconductor device in Embodiment 1 of the present invention.
Figure 3:
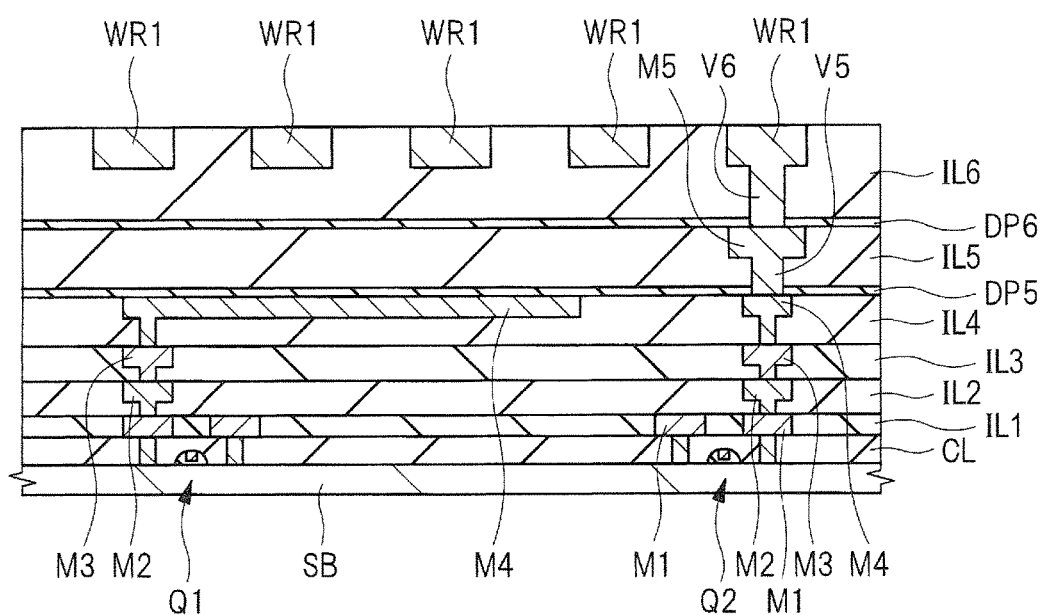
FIG. 3 is a cross-sectional view of a semiconductor device which is manufactured on a trial basis before the semiconductor device in Embodiment 1 is manufactured.
Figure 4:
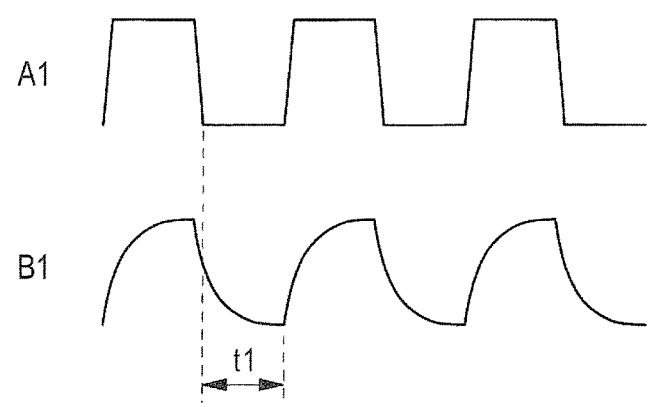
FIG. 4 is a timing chart showing the waveform of a signal in the semiconductor device shown in FIG. 3.
Figure 13:
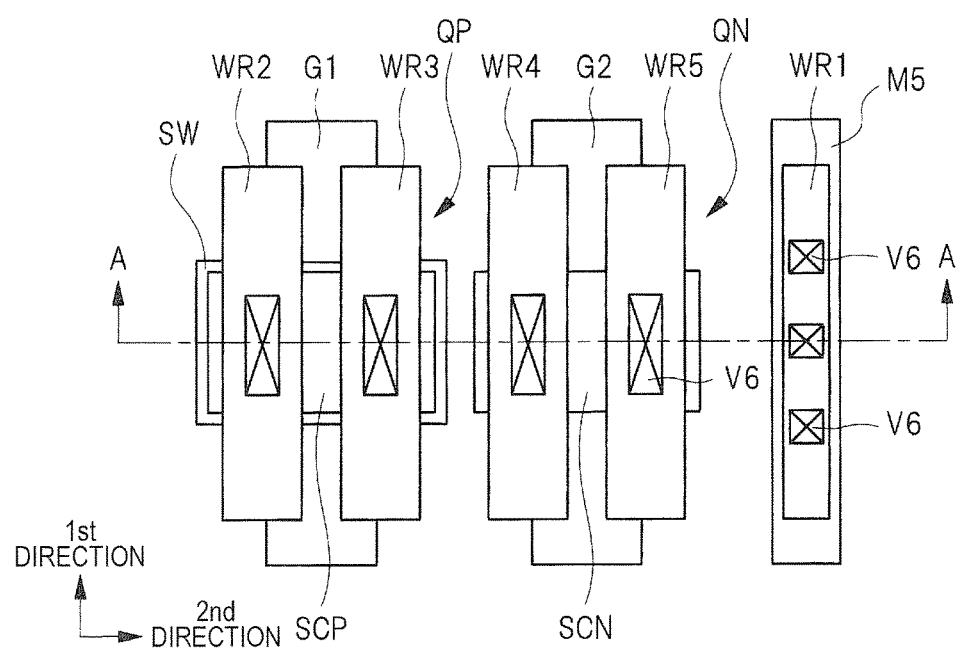
FIG. 13 is a plan view of the semiconductor device during the manufacturing process thereof, which is subsequent to FIG. 12.
Figure 14:
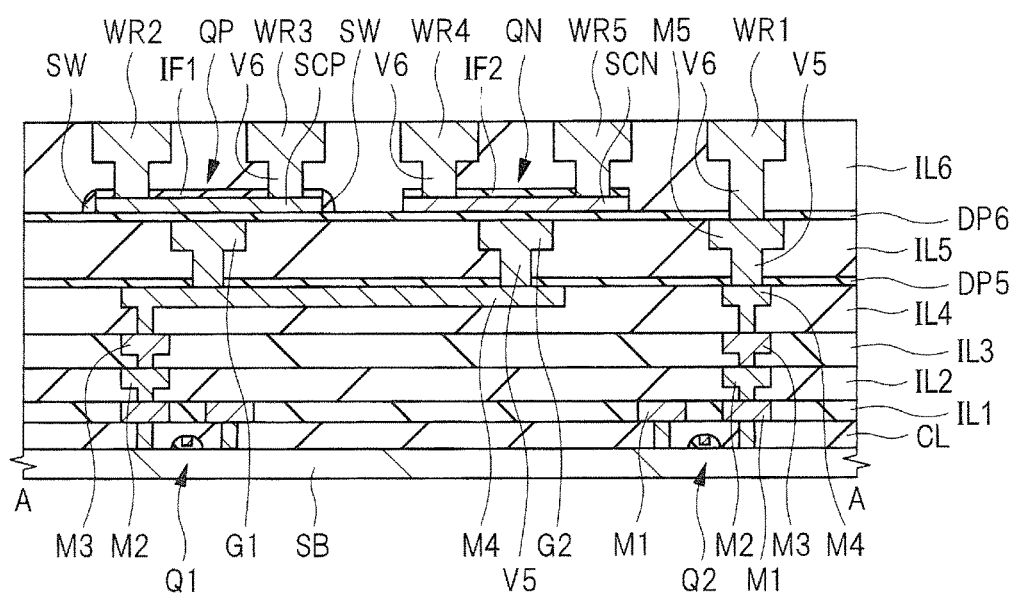
FIG. 14 is a cross-sectional view along the line A-A in FIG. 13.
Figure 15:
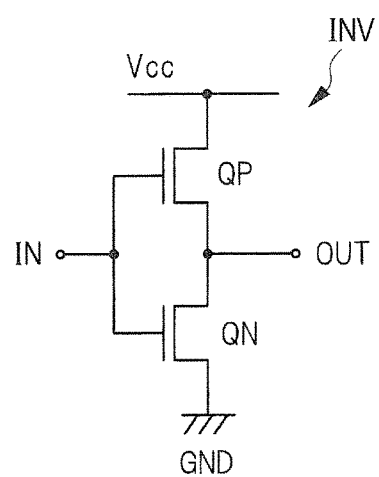
FIG. 15 is a circuit diagram of the inverter included in the semiconductor device in Embodiment 1 of the present invention.
Figure 16:
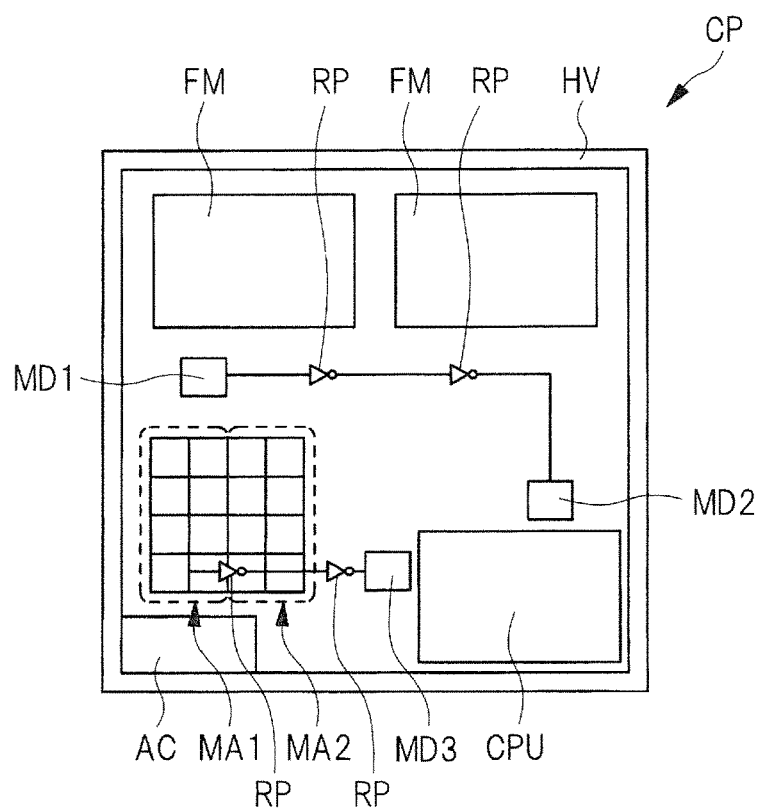
FIG. 16 is a schematic view showing a layout of the semiconductor device in Embodiment 1 of the present invention.

The manufacturing process of a semiconductor device in Embodiment 1 will be described using FIGS. 1 to 16. FIGS. 1 and 2 are flow charts each illustrating the manufacturing process of the semiconductor device in the present embodiment. FIG. 3 is a cross-sectional view of a semiconductor device which is manufactured on a trial basis before the semiconductor device in Embodiment 1 is manufactured. FIG. 4 is a timing chart showing the waveform of a signal in the semiconductor device shown in FIG. 3. FIGS. 5 to 12 and 14 are cross-sectional views of the semiconductor device in the present embodiment during the manufacturing process thereof. FIG. 13 is a plan view of the semiconductor device in the present embodiment during the manufacturing process thereof. FIG. 14 is a cross-sectional view along the line A-A in FIG. 13. FIG. 15 is a circuit diagram of the inverter included in the semiconductor device in the present embodiment. FIG. 16 is a schematic diagram showing a layout of a semiconductor chip as the semiconductor device in the present embodiment.

The following will describe a method of manufacturing the semiconductor device along the flow shown in FIGS. 1 and 2. Note that, in Steps S1 to S3 and R1 in FIG. 1, provisional design is performed using a computer or the like without performing a real manufacturing process. FIG. 2 is a flow chart specifically illustrating Steps S4 and R2 in FIG. 1.

In the manufacturing process of the semiconductor device in the present embodiment, floor planning is performed first (Step S1 in FIG. 1). That is, the positions where modules such as a logic circuit, an analog circuit, a memory array, a CPU, or an I/O and the like are placed in the semiconductor chip are determined. The I/O mentioned herein is a circuit having the function of inputting a signal or the like to the semiconductor chip from the outside thereof and the function of outputting a signal to the outside of the semiconductor chip, which is driven with a relatively high voltage.

Next, the arrangement of the elements included in each of the modules is determined (Step S2 in FIG. 1). For example, the arrangement of a NAND, a NOR, a FF, and the like included in the logic circuit as one of the foregoing modules is designed and the arrangement of the MOSFETs (Metal Oxide Semiconductor Field Effect Transistors or MOS field effect transistors), diode, resistive element, capacitive element, and the like which are included in such a circuit is designed. Here, the arrangement of the MOSFETs included in a memory array as one of the foregoing modules or the like is designed. The memory array is a module in which memory cells each formed of a MOSFET or the like are arranged in the form of an array (in the form of rows and columns). Here, a layout of a plurality of wiring layers over the foregoing elements is also designed.

There are such cases where a long-distance wire needs to be provided in the semiconductor chip and a signal for the logic circuit is transmitted using the long-distance wire and where a long-distance wire needs to be provided in the semiconductor chip and an output signal from the memory array is transmitted using the long-distance wire. In such a case, a problem arises in that the signal transmitted via the long-distance wire is delayed due to the parasitic capacitance of the long-distance wire (signal wire) or the like. In the case where such a timing delay needs to be reduced, design in which a repeater is inserted (formed) in the middle of the long-distance wire is performed (Step R1 in FIG. 1). The MOSFET included in the repeater of which the formation position is determined in Step R1 may be a MOSFET formed in the vicinity of the main surface of the semiconductor substrate or a MOSFET formed in the wiring layers formed over the elements formed in the vicinity of the main surface of the semiconductor substrate.

Next, a clock tree is produced (Step S3 in FIG. 1). The production of the clock tree corresponds to performing design in which clock drivers which supply a pulse signal (clock signal) used to achieve the synchronization of time-series signal processing operations are configured in the form of a tree and arranged to be dispersed in the semiconductor chip. The clock tree production is one of clock design methods. The clock tree method has the characteristic features of relatively easy adjustment of a clock skew and relatively easy design of an LSI (Large Scale Integration).

Next, a real semiconductor substrate is provided and semiconductor elements and a plurality of stacked wiring layers are successively formed thereover (Step S4). The operation of the semiconductor device thus formed is inspected and, when a faulty operation resulting from a timing delay in a long-distance wire is found, a repeater is inserted (formed) in the middle of the long-distance wire for timing improvement (Step R2 in FIG. 1). That is, design in which a new repeater is provided is performed and the semiconductor device including the repeater is formed again. The main characteristic feature of the present embodiment is that the repeater newly provided in Step R2 in FIG. 1 is formed in the wiring layers.

Using FIG. 2, the following will specifically describe the process performed in Steps S4 and R2 in FIG. 1. That is, Steps S41 to S44 in FIG. 2 correspond to Step S4 in FIG. 1 and Step R20 in FIG. 2 corresponds to Step R2 in FIG. 1.

As shown in FIG. 2, when the semiconductor device is manufactured, the semiconductor substrate is provided first (Step S41 in FIG. 2).

Next, in the vicinity of the main surface of the semiconductor substrate, semiconductor elements (in-substrate elements) such as a transistor such as a MOSFET, a diode, a resistive element, a capacitive element, and a storage element are formed (Step S42 in FIG. 2). MOSFETs Q1 and Q2 (see FIG. 3) formed herein include, e.g., source/drain regions formed in the main surface of the semiconductor substrate and gate electrodes formed over the main surface via gate insulating films. However, in the present application, a MOSFET formed in the vicinity of the main surface of the semiconductor substrate is referred to as an "in-substrate MOSFET" unless otherwise described. Also, a MOSFET described later using FIGS. 5 to 14 and the like, i.e., MOSFET formed over the foregoing semiconductor elements is referred to as "wiring-layer MOSFET". That is, in the description given in the present application, the in-substrate MOSFET is distinguished from the MOSFET formed in the wiring layers.

Next, over the in-substrate elements, the stacked wiring layers are formed (Step S43 in FIG. 2). That is, as shown in FIG. 3, the MOSFETs Q1 and Q2 as the elements in the semiconductor substrate SB are covered with an interlayer insulating film CL and contact plugs (coupling portions) extending through the interlayer insulating film CL are formed to couple the contact plugs to the in-substrate elements. Subsequently, over the interlayer insulating film CL, an interlayer insulating film IL1 and wires M1 extending through the interlayer insulating film IL1 and electrically coupled to the contact plugs are formed. The interlayer insulating film IL1 and the wires M1 are included in the first wiring layer. Subsequently, over the interlayer insulating film IL1, an interlayer insulating film IL2, wires M2 to be embedded in the trenches in the upper surface of the interlayer insulating film IL2, and vias (coupling portions) extending through the interlayer insulating film IL2 to electrically couple the wires M2 and M1 to each other are formed. The interlayer insulating film IL2, the wires M2, and the vias are included in the second wiring layer.

Subsequently, the same manufacturing process as performed for the second wiring layer is performed to successively form a third wiring layer, a fourth wiring layer, and a fifth wiring layer over the second wiring layer. Note that, at the bottom portion of the fifth wiring layer, an insulating film DP5 as a diffusion prevention film (cap insulating film) is formed. At the bottom portion of each of the second to fourth wiring layers also, an insulating film as the diffusion protection film is formed, though the illustration thereof is omitted. The diffusion prevention film is provided so as to prevent the metal (e.g., Cu (copper)) forming each of the wires from being diffused in the interlayer insulating film over the wires. The insulating film DP5, an interlayer insulating film IL5, wires M5, and vias V5 formed at the bottom portions of the wires M5 and extending through the insulating film DP5 and the interlayer insulating film IL5 are included in the fifth wiring layer.

Subsequently, over the interlayer insulating film IL5 included in the fifth wiring layer, an insulating film DP6 as a diffusion prevention film and an insulating film IL6 are formed in succession. Subsequently, using a photolithographic technique and a dry etching method, trenches are formed in the upper surface of the insulating film IL6. Then, in the bottom surfaces of the trenches, via holes (coupling holes) exposing the upper surfaces of the wires M5 are formed using a photolithographic technique and a dry etching method. Subsequently, in each of the trenches and the via holes, a conductor film mainly made of, e.g., Al (aluminum) is embedded to form wires WR1 in the trenches and vias V6 in the via holes.

In this manner, the stacked wiring layers are formed (Step S43 in FIG. 2), whereby the semiconductor device is formed. A part of each of the wires WR1 can be used as a pad electrode as a target to which a wire outside the semiconductor chip is to be bonded. Note that it may also be possible to form a rewire electrically coupled to the wire WR1 over the insulating film IL6 and provide a pad electrode over the upper surface of the rewire.

The description has been given herein of the method in which the wires WR1 and the vias V6 are formed in the wire trenches and the via hole in the same process, i.e., a so-called dual damascene method. Note that, in the second to fifth wiring layers also, the wires and the vias are formed using the dual damascene method.

However, the wires WR1 and the vias V6 may also be formed without using the dual damascene method. That is, it may also be possible that, e.g., after a via hole is formed to extend through the insulating films IL6 and DP6, an Al film to be embedded in the via hole is formed by a sputtering method or the like and then the Al film over the insulating film IL6 is patterned using a photolithographic technique and a dry etching method to thus form a via made of the Al film in the via hole and wires each made of the patterned Al film over the insulating film IL6. That is, the wires WR1 need not necessarily be embedded in the insulating film IL6.

Next, by checking the operation of the semiconductor device formed as described above, the presence or absence of a delay in the transmission of a signal in the logic circuit is examined (Step S44 in FIG. 2). This is because it is difficult to form the semiconductor device without having any trouble with the timing of signal transmission in the first round of design and improvements are needed in most cases. That is, in the semiconductor device formed by performing Steps S41 to S43 before Step S44 in FIG. 2 is performed is a semiconductor device formed for inspection. In other words, the semiconductor device is a provisional semiconductor device formed on a trial basis.

The signal to be inspected herein is not limited to the signal flowing in the long-distance wire coupled to the logic circuit and may also be a signal flowing in the long-distance wire coupled to the memory array or the like. That is, a signal flowing in any wire may be a target of timing inspection as long as the wire is a long-distance wire in which a delay may occur due to the long length of the wire.

Examples of the long-distance wire include the wire used to transfer data between the memory array and the I/O, i.e., a bus line.

If no timing delay is found, it is unnecessary to make a design change such that an extra element is added to the semiconductor device for delay reduction. By contrast, when a timing delay is found, a design change is made such that a repeater is provided to reduce the delay (Step R20 in FIG. 2) and then the manufacturing process of the semiconductor device (Steps S41 to S43 in FIG. 2) is performed again in accordance with the design change. The repeater added as a result of the design change is formed of the wiring-layer MOSFETs. The manufacturing process of the semiconductor device including the repeater in the present embodiment will be described specifically later using FIGS. 5 to 14.

In the step of checking the operation of the circuit performed in Step S44 in FIG. 2, a signal waveform as shown in, e.g., FIG. 4 is detected. In each of the signals A1 and B1 in the timing chart shown in FIG. 4, a signal "1" is output when the voltage is highest and a signal "0" is output when the voltage is lowest. Here, the waveform of the signal transmitted via a relatively-long-distance wire such as that coupling a module to another module in the semiconductor chip is inspected.

In the case where there is no delay in the waveform of the signal, the signal shows a rectangular waveform having a short rise time and a short fall time, such as that shown by the signal A1 in FIG. 4. In the case where there is a delay in the waveform of the signal, even when the signal input to the long-distance wire has a rectangular waveform such as that of the signal A1, the signal output via the long-distance wire has a wavy waveform, not the rectangular waveform, such as that shown by the signal B1 in FIG. 4.

As shown in FIG. 4, the signal A1 has a short rise time and a short fall time so that whether the signal represents "0" or "1" is clear. Since the transition time between "0" and "1" is short, there is little delay. However, in the signal B1, the transition time is long in either of the cases where the signal shifts from a "0" state to a "1" state and where the signal shifts from the "1" state to the "0" state. Consequently, in the signal B1, the timing of signal transmission is delayed by a time t1 from that in the signal A1.

The main reason for the occurrence of such a delay as has occurred in the signal B1 is that the long-distance wire which transmits the signal has a parasitic capacitance between itself and another wire. This results in the problem that a delay is likely to occur in the signal transmitted through the long-distance wire. When a timing delay has thus occurred, the speed of a read operation to the memory array may decrease to possibly slow the operation of the semiconductor device. Besides, since the logic circuit or the like does not operate with an intended timing, the semiconductor device may not normally operate.

Accordingly, in the case where a timing delay occurs, it is necessary to make a design change such that a repeater is added, as shown in Step R20 in FIG. 2, and thus reduce the delay. The reduction in (correction or removal of) the signal delay (timing delay) mentioned herein indicates the restoration of the waveform of the signal flowing through the long-distance wire which was originally rectangular and has changed to a curved shape due to the parasitic capacitance of the long-distance wire or the like to the original rectangular shape. When a delay occurs, the amplitude of the signal waveform may be reduced. Therefore, when the delay is reduced, the amplitude of the signal waveform is also restored.

That is, here, the inspection semiconductor device including a circuit such as a logic circuit having a long-distance wire is formed and then inspection is performed on the signal flowing through the long-distance wire to find a delay in the signal. Then, a design change is made on the structure of the inspection semiconductor device such that a repeater to be inserted in the long-distance wire is added. In accordance with the design change, the semiconductor device having the repeater in the present embodiment is formed.

Figure 5:
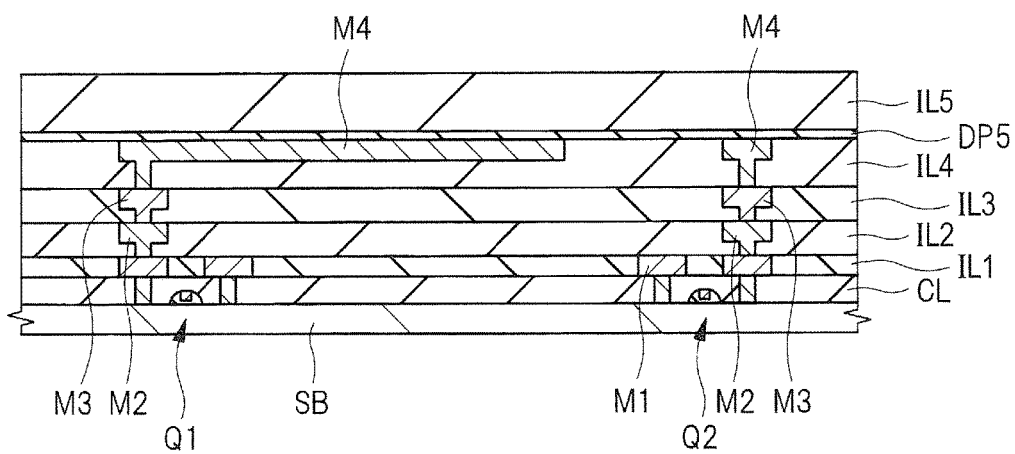
FIG. 5 is a cross-sectional view of the semiconductor device in Embodiment 1 of the present invention during the manufacturing process thereof.

Using FIGS. 5 to 16, the following will describe the formation of the MOSFETs included in the repeater for delay correction in the wiring layers. In FIGS. 5 and 14, the semiconductor substrate SB, the in-substrate elements, the first to fourth wiring layers, and the structure above the fourth wiring layer are shown. However, the illustration of the structure below the fifth wiring layer is omitted in FIGS. 6 to 12.

After the design change in Step R20 shown in FIG. 4 is made, in the process of manufacturing the semiconductor device again, the semiconductor substrate SB is provided first, as shown in FIG. 5 (Step S41 in FIG. 2). Then, the MOSFETs Q1 and Q2 as the in-substrate elements are formed (Step S42 in FIG. 2). The MOSFETs Q1 and Q2 are the elements included in a module (e.g., logic circuit).

Subsequently, the stacked wiring layers are formed (Step S43 in FIG. 2). In the process of forming the stacked wiring layers, in the same manner as in the process described using FIGS. 2 and 3, the first to fifth wiring layers are formed over the semiconductor substrate. Then, over the fifth wiring layer, a wiring layer including an Al wire used as the pad electrode is formed but, as shown in FIG. 5, the first to fourth wiring layers are formed first herein. Then, over the interlayer insulating film IL4 forming the fourth wiring layer, the insulating film DP5 as a diffusion prevention film and the interlayer insulating film IL5 are successively formed using, e.g., a CVD (Chemical Vapor Deposition) method. The insulating film DP5 is made of, e.g., SiN (silicon nitride), SiCN (silicon carbonitride), or the like. The interlayer insulating film IL5 is made of, e.g., $SiO_2$ (silicon dioxide) or the like.

Figure 6:
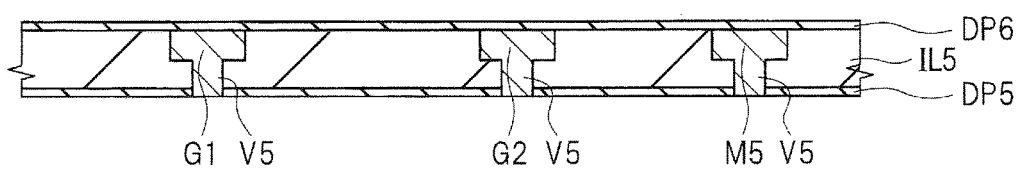
FIG. 6 is a cross-sectional view of the semiconductor device during the manufacturing process thereof, which is subsequent to FIG. 5.

Next, as shown in FIG. 6, the wires M5, gate electrodes G1 and G2, and the vias V5 are formed using the dual damascene method. That is, using a photolithographic technique and a dry etching method, a plurality of trenches (wire trenches) are formed in the upper surface of the interlayer insulating film IL5. Then, in the bottom surfaces of the trenches, via holes exposing the upper surfaces of the wires M4 are formed using a photolithographic technique and a dry etching method. Note that the foregoing trenches may also be formed after the formation of the via holes. The wires M5, the gate electrodes G1 and G2, and the vias V5 thus formed are embedded in the interlayer insulating film IL5.

Subsequently, using, e.g., a sputtering method and a plating method, a conductor film mainly made of, e.g., Cu (copper) is embedded in each of the trenches and the via holes. Using, e.g., a CMP (Chemical Mechanical Polishing) method, the excess conductor film over the interlayer insulating film IL5 is removed. By forming a thin barrier conductor film by a sputtering method or the like before the foregoing conductor film is formed, copper in the foregoing conductor film can be prevented from being diffused into the interlayer insulating film IL5, though not shown. The barrier conductor film includes, e.g., Ta (tantalum).

Thus, the respective wires M5 embedded in the plurality of trenches, the gate electrode G1 and G2, and the respective vias V5 in the plurality of via holes are formed. The insulating film DP5, the interlayer insulating film IL5, the wires M5, the gate electrodes G1 and G2, and the vias V5 are included in the fifth wiring layer. Subsequently, the insulating film DP6 covering the respective upper surfaces of the interlayer insulating film IL5, the wires M5, and the gate electrodes G1 and G2 is formed. Note that, as the material of the wires M5 and the gate electrodes G1 and G2, Al (aluminum) can also be used.

In the plurality of trenches formed in the upper surface of the interlayer insulating film IL5, the gate electrodes G1 and G2 and the wires M5 each made of the same material are formed. The gate electrodes G1 and G2 are electrically coupled to the lower-layer wires M4 (see FIG. 5) via the vias V5. The wires M5 are electrically coupled to the lower-layer wires M4 (see FIG. 5) via the vias V5.

Figure 7:
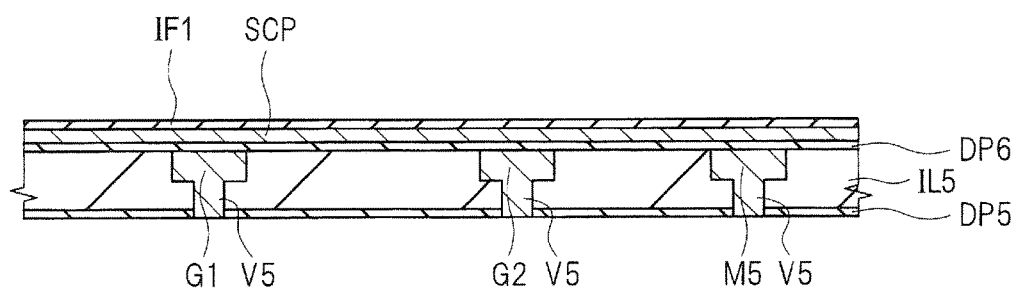
FIG. 7 is a cross-sectional view of the semiconductor device during the manufacturing process thereof, which is subsequent to FIG. 6.

Next, as shown in FIG. 7, over the insulating film DP6, a semiconductor layer SCP made of a first oxide semiconductor layer serving as the channel layer (channel region) of a first transistor is formed using, e.g., a sputtering method. Examples of a preferred material for the channel layer include an InGaZnO(IGZO) layer, an InZnO layer, a ZnO layer, a ZnAlO layer, a ZnCuO layer, a NiO layer, a SnO layer, a $SnO_2$ layer, a CuO layer, a $Cu_2O$ layer, a $Ta_2O_5$ layer, and a $TiO_2$ layer. Since an oxide semiconductor can be formed at a relatively low temperature, the oxide semiconductor is particularly preferable as a material for the channel layer formed in the wiring layers. The film thickness of the semiconductor layer SCP is about 10 to 50 nm.

Note that the semiconductor layer SCP is a P-type semiconductor layer. The semiconductor layer SCP is any of the ZnO layer, the ZnAlO layer, the ZnCuO layer, the NiO layer, the SnO layer, and the $Cu_2O$ layer among the foregoing first oxide semiconductor layers.

Subsequently, over the semiconductor layer SCP, an insulating film IF1 used as a hard mask is formed by, e.g., a plasma CVD method. Examples of a material for the insulating film IF1 include insulating films made of silicon dioxide ($SiO_2$), silicon oxycarbide (SiOC), carbon (C), silicon nitride (SiN), and the like and a combination thereof. Preferably, the film thickness of the insulating film IF1 is about 30 to 200 nm.

Figure 8:
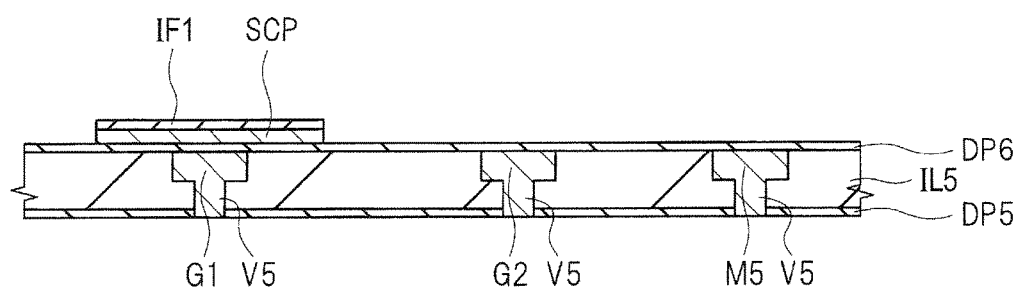
FIG. 8 is a cross-sectional view of the semiconductor device during the manufacturing process thereof, which is subsequent to FIG. 7.

Next, as shown in FIG. 8, the semiconductor layer SCP and the insulating film IF1 are patterned using a photolithographic technique and a dry etching method. As a result, a stacked film including the semiconductor layer SCP and the insulating film IF1 remains immediately over the gate electrode G1 via the insulating film DP6, while the semiconductor layer SCP and the insulating film IF1 are removed from the region other than the vicinity of the region immediately over the gate electrode G1. That is, the semiconductor layer SCP serving as the channel layer of the first transistor is formed in an island shape. Then, a resist (not shown) over the insulating film IF1 is removed therefrom. At this point, in addition to the insulating films DP6 and IF1, the side surfaces of the island-shaped semiconductor layer SCP under the insulating film IF1 are also exposed.

Figure 9:
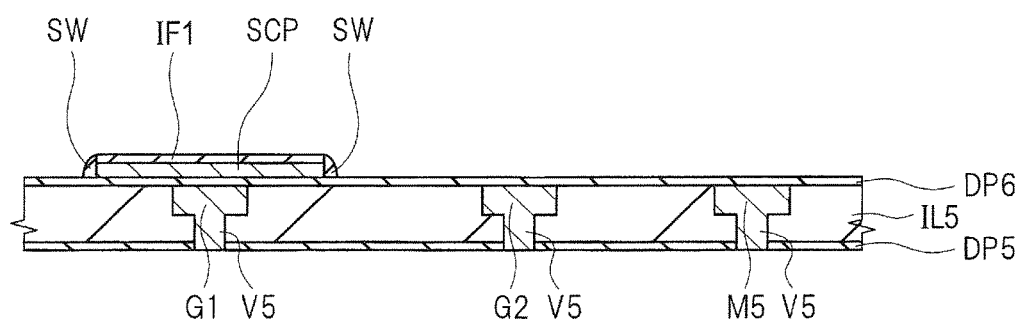
FIG. 9 is a cross-sectional view of the semiconductor device during the manufacturing process thereof, which is subsequent to FIG. 8.

Next, as shown in FIG. 9, over the insulating films DP6 and IF1, a covering insulating film serving as sidewalls SW is formed by, e.g., a CVD method. Examples of a material for the covering insulating film include silicon dioxide ($SiO_2$), silicon nitride (SiN), and the like. The film thickness of the covering insulating film is about 10 to 200 nm. The covering insulating film covers not only the surfaces of the insulating films DP6 and IF1, but also the exposed side surfaces of the semiconductor layer SCP.

Subsequently, an etch-back process is performed on the covering insulating film. As a result, the upper surface of the insulating film DP6 is exposed and the sidewalls SW are formed over the respective side surfaces of the semiconductor layer SCP and the insulating film IF1. The sidewalls SW cover the side surfaces of the island-shaped semiconductor layer SCP to protect the semiconductor layer SCP from the influence of another film, the process, or the like. Given the function of the sidewalls SW, it is sufficient for the sidewalls SW to cover at least the side surfaces of the semiconductor layer SCP even though the sidewalls SW do not cover the side surfaces of the insulating film IF1.

Figure 10:
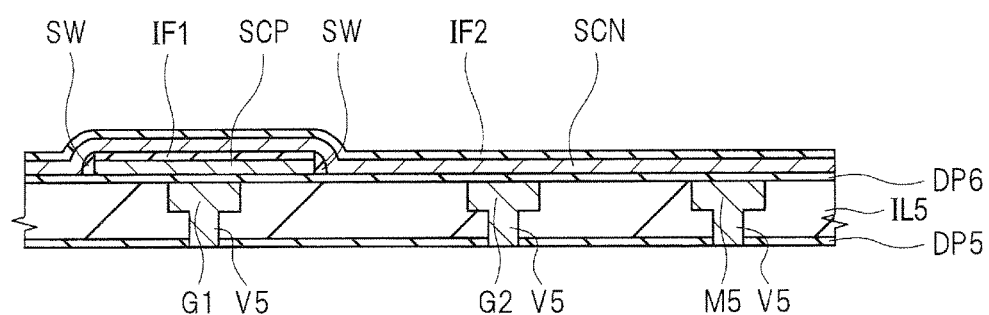
FIG. 10 is a cross-sectional view of the semiconductor device during the manufacturing process thereof, which is subsequent to FIG. 9.

Next, as shown in FIG. 10, over the insulating films DP6 and IF1 and the sidewalls SW, a semiconductor layer SCN as a second oxide semiconductor layer serving as the channel layer (channel region) of a second transistor is formed using, e.g., a sputtering method. Examples of a preferred material for the channel layer include an InGaZnO(IGZO) layer, an InZnO layer, a ZnO layer, a ZnAlO layer, a ZnCuO layer, a NiO layer, a SnO layer, a $SnO_2$ layer, a CuO layer, a $Cu_2O$ layer, a $Ta_2O_5$ layer, and a $TiO_2$ layer. Since an oxide semiconductor can be formed at a relatively low temperature, the oxide semiconductor is particularly preferable as a material for the channel layer formed in the wiring layers. The film thickness of the semiconductor layer SCN is about 10 to 50 nm.

Note that the semiconductor layer SCN is an N-type semiconductor layer. The semiconductor layer SCN is any of the InGaZnO (IGZO) layer, the InZnO layer, the ZnO layer, the $SnO_2$ layer, the CuO layer, the $Ta_2O_5$ layer, and the $TiO_2$ layer among the foregoing second oxide semiconductor layers.

In the present embodiment, the first oxide semiconductor layer SCP is formed first, and then the second oxide semiconductor layer SCN is formed. However, these semiconductor layers may also be formed in reverse order.

Subsequently, over the semiconductor layer SCN, an insulating film IF2 used as a hard mask is formed by, e.g., a plasma CVD method. Examples of a material for the insulating film IF2 include insulating films made of silicon dioxide ($SiO_2$), silicon oxycarbide (SiOC), carbon (C), silicon nitride (SiN), and the like and a combination thereof. Preferably, the film thickness of the insulating film IF2 is about 30 to 200 nm.

Figure 11:
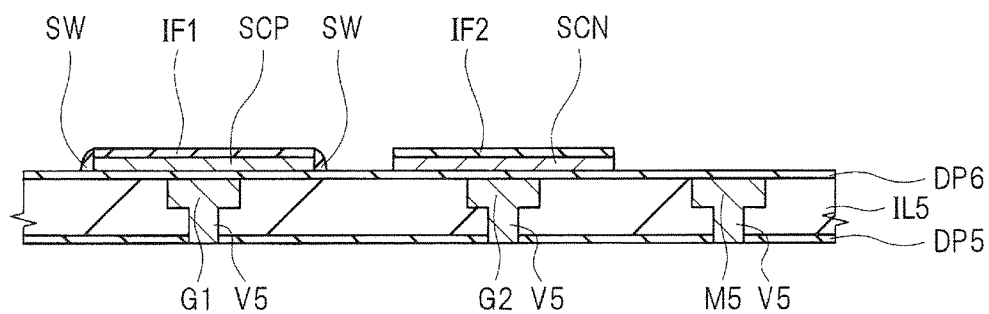
FIG. 11 is a cross-sectional view of the semiconductor device during the manufacturing process thereof, which is subsequent to FIG. 10.

Next, as shown in FIG. 11, the semiconductor layer SCN and the insulating film IF2 are patterned using a photolithographic technique and a dry etching method. As a result, stacked films including the semiconductor layer SNC and the insulating film IF2 remain immediately over the gate electrode G2 via the insulating film DP6, while the semiconductor layer SCN and the insulating film IF2 are removed from the region other than the vicinity of the region immediately over the gate electrode G2. That is, the semiconductor layer SCN serving as the channel layer of the second transistor is formed in an island shape. Then, a resist (not shown) over the insulating film IF2 is removed therefrom. In this manner, over the insulating film DP6, the stacked films including the insulating film IF1 and the semiconductor layer SCP, the sidewalls SW covering the side walls of the stacked films, and the stacked films including the insulating film IF2 and the semiconductor layer SCN are formed.

Figure 12:
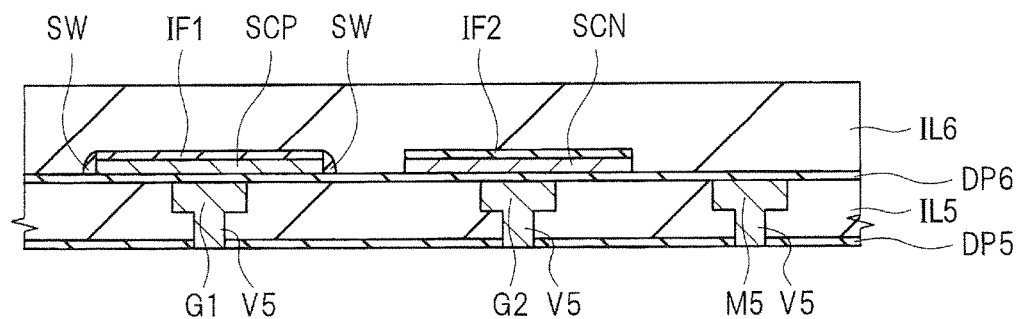
FIG. 12 is a cross-sectional view of the semiconductor device during the manufacturing process thereof, which is subsequent to FIG. 11.

Next, as shown in FIG. 12, the insulating film IL6 is formed so as to cover the insulating films DP6 and IF1, the sidewalls SW, and the insulating film IF2. The insulating film IL6 is made of silicon dioxide ($SiO_2$) or a carbon-containing film such as a SiOC(H) film as a low-dielectric-constant insulating film having a dielectric constant lower than that of silicon dioxide.

Subsequently, as shown in FIGS. 13 and 14, the plurality of vias V6 and the wires WR1 to WR5 are embedded in the insulating film IL6 using a dual damascene method. By this process, the first and second transistors QP and QN are formed in the wiring layers. In FIG. 13, the illustration of the insulating films such as the insulating film IL6 is omitted. FIG. 13 shows only the layout of the first transistor QP as a PMOS (P-channel MOSFET), the second transistor QN as an NMOS (N-channel MOSFET), the wires M5, the vias V6, and the wires WR1 to WR5. In FIG. 13, the first transistor QP, the second transistor QN, the wires M5, the vias V6, and the wires WR1 to WR5 are shown through the vias V6 under the wires WR1 to WR5.

In the process step, first, as shown in FIG. 14, a plurality of trenches (wire trenches) are formed in the upper surface of the insulating film IL6 using a photolithographic technique and a dry etching method. Then, at the bottom surfaces of theses trenches, via holes exposing the respective upper surfaces of the semiconductor layers SCP and SCN and the wires M5 are formed using a photolithographic technique and a dry etching method.

Here, the upper surface of the semiconductor layer SCP is exposed by at least each of one pair of via holes. On the other hand, the upper surface of the semiconductor layer SCN is exposed by at least each of another pair of via holes. The pair of via holes located over the semiconductor layer SCP are formed in the respective bottom surfaces of different trenches. Also, the pair of via holes located over the semiconductor layer SCN are formed in the respective bottom surfaces of different trenches. The trenches and the via holes are formed also at positions not overlapping the semiconductor layers SCP and SCN in plan view. The upper surface of the wire M5 is exposed through some of the via holes.

In the process of forming the foregoing via holes extending through the insulating film IL6, when the via holes are formed by a dry etching method, the respective upper surfaces of the semiconductor layers SCP and SCN are subjected to etching. As a result, the respective upper surfaces of the semiconductor layers SCP and SCN exposed at the bottom portions of the via holes are modified to have lower resistances. The lower-resistance regions formed by this process serve as the respective source/drain regions of the first and second transistors QP and QN formed in the wiring layers.

In this manner, the first transistor (PMOS) QP having the semiconductor layer SCP as the channel layer, the pair of source/drain regions in the upper surface of the semiconductor layer SCP, and the gate electrode G1 formed immediately under the semiconductor layer SCP via the insulating film DP6 as the gate insulating film is formed. Also, the second transistor (NMOS) QN having the semiconductor layer SCN as the channel layer, the pair of source/drain regions in the upper surface of the semiconductor layer SCN, and the gate electrode G2 formed immediately under the semiconductor layer SCN via the insulating film DP6 as the gate insulating film is formed.

Note that, in the present embodiment, the gate insulating film of the first transistor QP and the gate insulating film of the second transistor QN are formed of the insulating film DP6 in the same layer. However, the respective gate insulating films of the first and second transistors QP and QN may also be formed separately.

The first and second transistors QP and QN are the MOSFETs formed in the wiring layers, unlike such elements formed in the vicinity of the main surface of the semiconductor substrate as the in-substrate MOSFETs included in the memory cell, the logic circuit, and the like. That is, the first and second transistors QP and QN are the wiring-layer MOSFETs formed above the in-substrate MOSFETs and the first to fourth wiring layers.

Subsequently, in the foregoing trenches and the foregoing via holes, a conductor film mainly made of Al (aluminum) is embedded. Then, by removing the excess conductor film from over the insulating film IL6, the wires WR1 to WR5 in the trenches and the vias V6 in the via holes 6 are formed. A part of each of the wires WR1 is used as the pad electrode as a target to which a wire outside the semiconductor chip is to be bonded. The wires WR2 and WR3 are electrically coupled respectively to the source/drain regions of the first transistor QP via the vias V6. The wires WR4 and WR5 are electrically coupled respectively to the source/drain regions of the second transistor QN via the vias V6. The wires WR1 are electrically coupled to the wires M5 via the vias V6.

The first and second transistors QP and QN are storage/conduction junctionless FETs (Field Effect Transistors) in which the gate electrodes are disposed under semiconductor layers in which the channels are formed. The storage/conduction junctionless FETs are hereinafter referred to simply as the junctionless FETs. The N-channel MOSFET formed in the vicinity of the main surface of the semiconductor substrate has the N-type channel region and the N-type source/drain regions. Electrons as carriers are stored in the channel region to bring the N-channel MOSFET into an ON state to cause electrical conduction between the source/drain regions.

On the other hand, the P-channel junctionless MOSFET (junctionless transistor) has the P-type channel region and the P-type source/drain regions. Holes as carriers are stored in the channel region to bring the P-channel junctionless MOSFET into an ON state to cause electrical conduction between the source/drain regions. When the junctionless FET is in the OFF state, the carriers in the channel layer (semiconductor layer SCP) move into the portions of the source/drain regions which are closer to the electrode, thus causing depletion in the channel layer. Accordingly, during an OFF period, a current does not flow between the source/drain regions.

In the present embodiment, a description will be given on the assumption that each of the wiring-layer MOSFETs is the junctionless FET. However, each of the wiring-layer MOSFETs may also be a known MOSFET having the source/drain regions formed by introducing an N-type impurity or a P-type impurity into the semiconductor layer. That is, each of the wiring-layer MOSFETs may also be a FET the ON/OFF state of which is switched through the inversion of the conductivity type of the channel. In this case, it can be considered to form the source/drain regions by, e.g., introducing a P-type impurity into a part of the semiconductor layer SCP and introducing an N-type impurity into a part of the semiconductor layer SCN after the formation of the semiconductor layer SCN shown in FIG. 11 and before the formation of the insulating film IL6.

As shown in FIG. 13, the semiconductor layer SCP is circumferentially surrounded by the sidewall SW. The wires WR1 to WR5, the gate electrodes G1 and G2, and the wires M5 extend in a first direction as a direction along the main surface of the semiconductor substrate (not shown).

The pair of vias V6 coupled to the semiconductor layer SCP are disposed to be arranged in a second direction as a direction along the main surface of the semiconductor substrate which is orthogonal to the first direction. The gate electrode G1 is disposed immediately below a middle position between the pair of vias V6 coupled to the semiconductor layer SCP in the second direction. The pair of vias V6 coupled to the semiconductor layer SCN are disposed to be arranged in the second direction. The gate electrode G2 is disposed immediately below a middle position between the pair of vias V6 coupled onto the semiconductor layer SCN in the second direction.

By the foregoing process, the semiconductor device in the present embodiment is manufactured. The description has been given herein of the case where the stacked wiring layers include six wiring layers including the wires WR1 to WR5 containing Al. However, the number of the wiring layers to be stacked may be larger or smaller than in the semiconductor device described above.

The adjustable parameters of the characteristics of a device include the breakdown voltage of the device and the threshold voltage of a transistor. These can be adjusted using the layout of the transistor. The breakdown voltage of the device can be adjusted using the distance between the gate electrode and the drain electrode (gate-drain offset distance).

The first and second transistors QP and QN in the present embodiment are included in a CMOS (Complementary Metal Oxide Semiconductor) forming an inverter and included in an inverter INV shown in FIG. 15. That is, the inverter INV includes the first and second transistors QP and QN included in the complementary transistor.

The input terminal of the inverter INV shown in FIG. 15 is coupled to the respective gate electrodes of the first and second transistors QP and QN which are included in the inverter INV. The output terminal of the inverter INV is coupled to the respective drain electrodes of the first and second transistors QP and QN. In the inverter INV, the source electrode of the first transistor QP is coupled to a power supply voltage (power supply potential) Vcc. The source electrode of the second transistor QN is coupled to a ground potential GND.

Note that the inverter INV in the present embodiment is a circuit coupled to a long-distance wire and used as a repeater (repeater circuit) which removes a signal delay and is not a circuit used in the I/O. That is, each of the input/output terminals of the inverter INV is not coupled directly to a device outside the semiconductor chip in which the inverter INV is formed. That is, the wires WR2 to WR5 shown in FIG. 14 are not used as bonding pad electrodes and are electrically coupled to the semiconductor elements in the vicinity of the main surface of the semiconductor substrate such as MOSFETs via the vias, the wires, and the like. In other words, the first and second transistors QP and QN are not high-breakdown-voltage elements and are driven with a voltage lower than the voltage supplied to the pad electrode of the semiconductor chip via a bonding wire, a solder ball, or the like.

FIG. 16 shows a semiconductor chip CP as the semiconductor device in the present embodiment. The semiconductor chip CP has a rectangular shape in plan view and has an I/O unit HV at the end portion thereof in plan view. Over the main surface of the semiconductor chip CP, a memory region FM, a processing unit CPU, memory arrays MA1 and MA2, modules MD1 to MD3, and the like are disposed. In FIG. 16, each of the memory arrays MA1 and MA2 is surrounded by the broken line. Each of the modules MD1 to MD3 is a logic circuit such as, e.g., a flip-flop circuit. The memory region FM, the processing unit CPU, the memory arrays MA1 and MA2, and the modules MD1 to MD3 are mainly formed of the in-substrate elements formed in the vicinity of the main surface of the semiconductor substrate.

The modules MD1 and MD2 away from each other are coupled to each other by a wire (long-distance wire) having a particularly long length among the wires in the semiconductor chip CP. Likewise, the memory arrays MA1 and MA2 are coupled to each other by a long-distance wire. The wire coupling the memory arrays MA1 and MA2 to the module MD3 is also a long-distance wire. It can be considered that the long-distance wires are formed of the Al wires in the uppermost one of the stacked wiring layers formed over the semiconductor substrate, such as, e.g., the wire WR1 shown in FIG. 13.

The inverter INV (see FIG. 15) including the first and second transistors QP and QN shown in FIGS. 13 and 14 is inserted as the repeater RP in the long-distance wire coupling the individual modules away from each other, such as the logic circuit and the memory array, to each other in the semiconductor chip CP shown in FIG. 16. That is, the repeater RP shown in FIG. 16 is formed of, e.g., the inverter INV shown in FIG. 15. The one repeater RP or a plurality of the repeaters RP are coupled in series in the middle of the long-distance wire.

Specifically, the repeater RP is inserted in the middle of the wire coupling the memory arrays MA1 and MA2 to each other, while the repeater RP is inserted in the middle of the wire coupling the memory array MA2 and the module MD3 to each other. The repeater RP is inserted also in the middle of the wire coupling the modules MD1 and MD2 to each other. Consequently, the signal output from, e.g., the module MD1 reaches the module MD2 via the plurality of repeater RP in the long-distance wires.

Next, a description will be given of the operation of the semiconductor device in the present embodiment using FIGS. 17 and 18.

The inverter INV shown in FIG. 15 is a logic NOT circuit. That is, the inverter INV is a circuit which inverts the signal input thereto and outputs the inverted signal. Accordingly, when "1" is input to the input of the inverter INV, the output thereof is "0" and, when "0" is input to the input of the inverter INV, the output thereof is "1".

Figure 17:
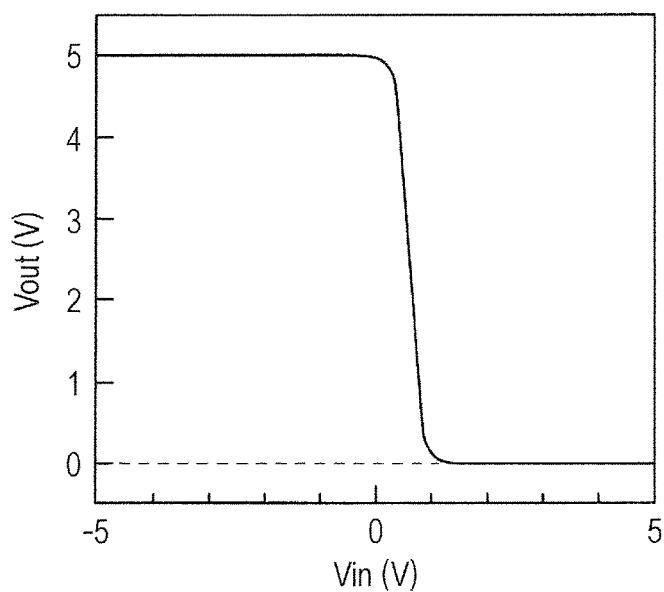
FIG. 17 is a graph showing the relationship between an input voltage to the inverter and an output voltage therefrom.
Figure 18:
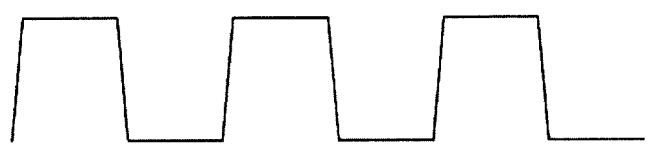
FIG. 18 is a timing chart showing the waveforms of an input signal to the inverter and an output signal therefrom.
Figure 18:
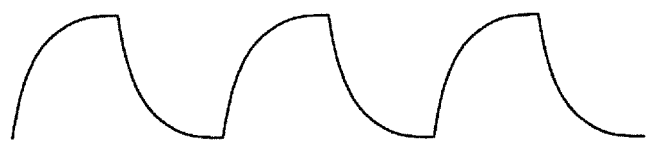
Figure 18:
Figure 18:
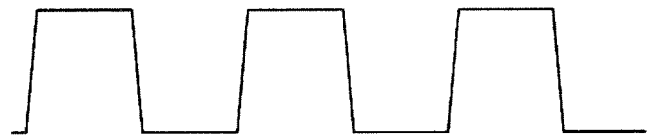

FIG. 17 shows a graph representing the relationship between an input voltage to the inverter and an output voltage from the inverter. The abscissa axis of the graph shows the input voltage to the inverter and the ordinate axis of the graph shows the output voltage from the inverter. As shown in FIG. 17, when the voltage of an input signal is high, i.e., when the signal is in the "1" state, the voltage of an output signal has a lower value, i.e., the signal is in the "0" state. Conversely, when the voltage of the input signal is lower, i.e., when the signal is in the "0" state, the voltage of the output signal has a higher value, i.e., the signal is in the "1" state. Thus, the inverter has the property of inverting the value of the input signal and outputting the inverted value.

The inverter also has the function of removing a delay when the delay has occurred in the signal input thereto. FIG. 18 shows a timing chart illustrating the waveforms of the input signal and the output signal to and from the inverter. In FIG. 18, a signal A2 is the signal input to the long-distance wire, similarly to the signal A1 described using FIG. 4. A signal B2 is the signal which has passed through the long-distance wire and has a waveform deformed into a wavy waveform, similarly to the signal B1 described using FIG. 4. That is, the signal B2 is a signal output through the long-distance wire. In the present embodiment, the input terminal of the inverter INV (see FIG. 15) is coupled to the long-distance wire. Accordingly, the signal B2 is the signal input to the inverter INV.

A signal C2 is the signal output from the inverter INV having the input terminal coupled to the long-distance wire. That is, the signal B2 flowing through the long-distance wire and output via the inverter INV has such a waveform as that of the signal C2. While passing through the long-distance wire, the signal input to the inverter INV has the shape thereof changed from that of the rectangular signal A2 to that of the wavy signal B2 and a delay has occurred therein. When the signal B2 having such a deformed waveform passes through the inverter INV, the signal B2 results in the rectangular signal C2 having high rise and fall speeds. That is, as a result of flowing through the inverter INV, the signal B2 having the delay has the waveform thereof restored to that of the signal C2 so that the delay is eliminated.

Note that the signal input to the inverter INV is inverted and then output. Consequently, the signals A2 and C2 have inverted signal values. In such a case also, when another inverter INV is inserted in the long-distance wire, the signal is inverted again so that a signal D2 having the same value as that of the signal A2 input to the long-distance wire can be transmitted. That is, when an even number of the inverters INV are coupled in series in the middle of the long-distance wire, it is possible to prevent the value of the signal from being inverted, while preventing the occurrence of a delay therein. The signal D2 in the timing chart shown in FIG. 18 is output from the second inverter INV in the long-distance wire.

Figure 19:
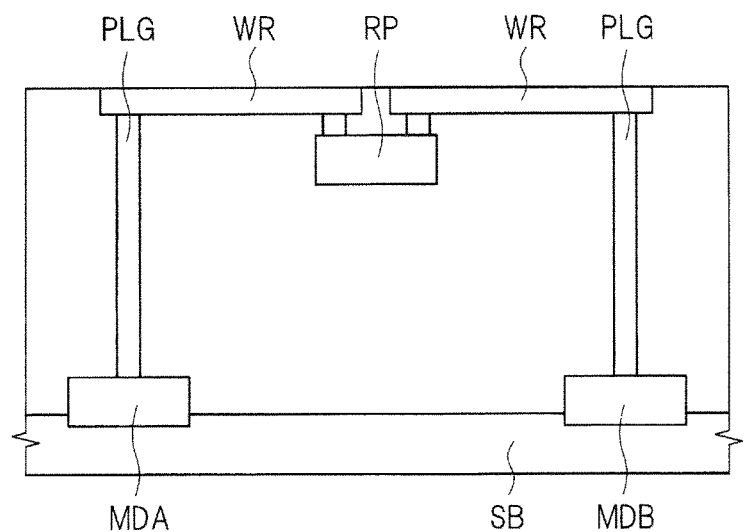
FIG. 19 is a schematic diagram showing the semiconductor device in Embodiment 1 of the present invention.
Figure 31:
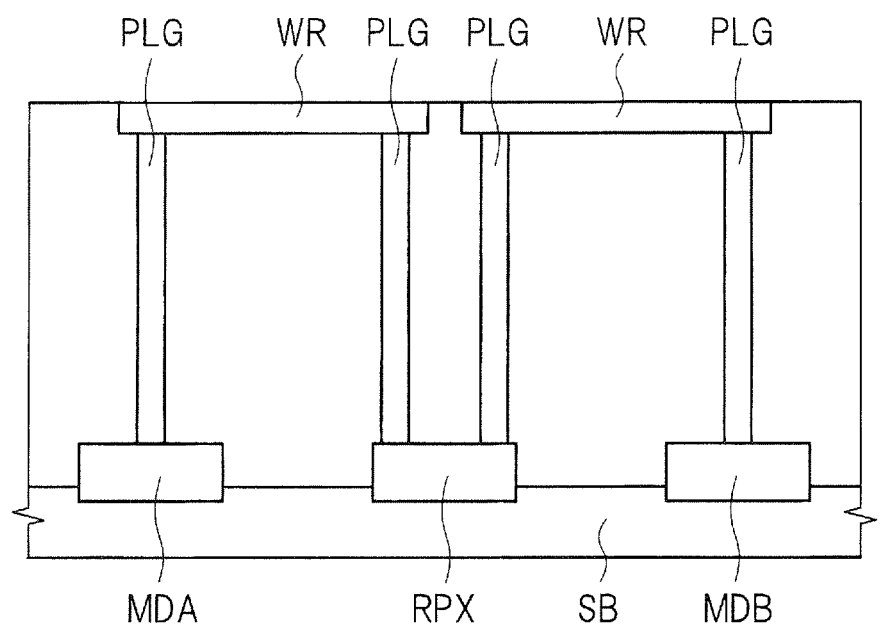
FIG. 31 is a schematic diagram of a semiconductor device in a comparative example.
Figure 32:
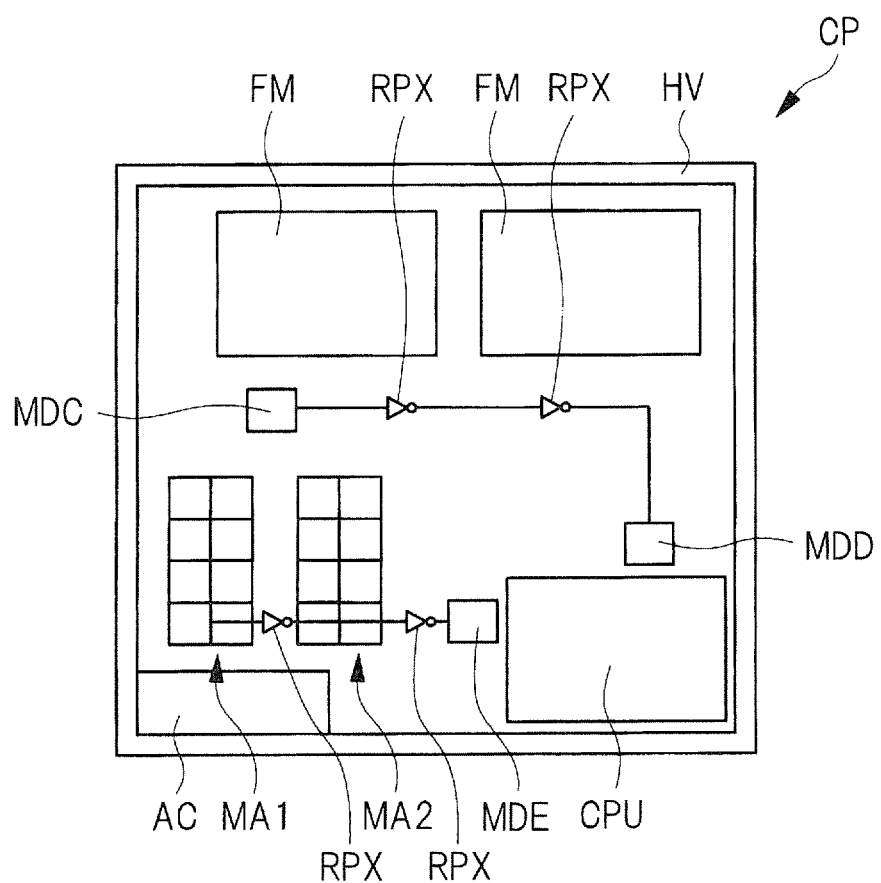
FIG. 32 is a schematic diagram of the semiconductor device in the comparative example.

Next, using FIGS. 19, 31, 32, and the like, a description will be given of the effect of the semiconductor device in the present embodiment. FIG. 19 is a schematic diagram showing the semiconductor device in the present embodiment. FIG. 31 is a schematic diagram showing a semiconductor device in a comparative example. FIG. 32 is a schematic diagram showing the layout of a semiconductor chip as the semiconductor device in the comparative example. FIGS. 19 and 31 are schematic diagrams each schematically showing a cross section of the semiconductor device. In these drawings, specific illustration of the plurality of stacked wiring layers is omitted and the wires and plugs (coupling portions) coupling the uppermost-layer wires to the elements are shown as one conductive path.

The semiconductor device in the comparative example shown in FIG. 31 has a module MDA including the elements (in-substrate elements) in the vicinity of the main surface of the semiconductor substrate SB and a module MDB including the elements (in-substrate elements) in the vicinity of the main surface of the semiconductor substrate SB. Over each of the modules MDA and MDB, the stacked wiring layers including the plurality of wiring layers are formed. In the uppermost one of the stacked wiring layers, long-distance wires (signal wires) WR are formed. Each of the modules MDA and MDB is coupled to plugs PLG as conductive path formed in the stacked wiring layers. Note that the plugs PLG are actually the conductive path including contact plugs, wires, and vias which are formed in the stacked wiring layers.

The module MDA as, e.g., a logic circuit and the module MDB as, e.g., a logic circuit are electrically coupled to each other via the long-distance wires WR in the uppermost layer. However, when a signal is intended to be transmitted via an excessively long wire, a delay occurs in the signal, as has been described using FIG. 4. Such a delay is found in the inspection in Step S44 in the process described using FIG. 2. To prevent the occurrence of the delay, in the present embodiment described above, the description has been given of the design change such that the repeater including the wiring-layer MOSFETs is inserted in the long-distance wire. However, in the comparative example shown in FIG. 31, a design change is made such that a repeater RPX including the in-substrate MOSFETs is inserted in the middle of the long-distance wire WR. Note that the repeater RPX is, e.g., an inverter.

That is, in the comparative example, between the long-distance wire WR coupled to the module MDA via the plug PLG and the long-distance wire WR coupled to the module MDB via the plug PLG, the repeater PRX is coupled. The MOSFET included in the repeater RPX is formed in the vicinity of the main surface of the semiconductor substrate SB.

The MOSFET over the substrate and the long-distance wire WR are electrically coupled to each other via the plugs PLG formed in the stacked wiring layers. That is, a conductive path for transmitting a signal from the module MDA extends from the module MDA and passes through the long-distance wire WR in the upper portion of the stacked wiring layers via the plug PLG. Then, the conductive path passes through the repeater RPX in the vicinity of the main surface of the semiconductor substrate SB via the plug PLG and subsequently passes through the long-distance wire WR in the upper portion of the stacked wiring layer via the plug PLG to reach the module MDA.

As a result, when the repeater RPX is added as a result of the design change, it is necessary to design again not only the layout of the elements in the vicinity of the main surface of the semiconductor substrate SB, but also the layout of all the stacked wiring layers including the contact plugs, the wires, and the vias which couple the in-substrate elements included in the repeater RPX to the long-distance wires WR in the uppermost layer. Making such a large-scale layout design change causes an increase in the manufacturing cost of the semiconductor device. In particular, a requirement for the re-design and re-production of a plurality of photomasks (reticles) causes the increase in the manufacturing cost of the semiconductor device.

Note that when the layout of all the wiring layers is changed, the number of the photomasks which need to be subjected to layout correction and re-production is about 30 to 40. In particular, in a semiconductor device which has been increasingly miniaturized, the use of a lithographic mask using ArF immersion lithography can be considered. In this case, the design change results in higher cost.

In addition, as shown in FIG. 32, in the semiconductor chip CP in the comparative example, the repeaters RPX for delay elimination are inserted in the respective wires between modules MDC and MDD, between the memory arrays MA1 and MA2, and between the memory array MA2 and a module MDE. The circuit configuration is the same as in the present embodiment described using FIG. 16. However, as has been described using FIG. 31, the comparative example shown in FIG. 32 is different from the present embodiment in that the repeaters RPX are formed in the vicinity of the main surface of the semiconductor substrate. That is, the modules MDC, MDD, and MDE and the memory arrays MA1 and MA2 which are shown in FIG. 32 correspond to the modules MDA and MDB shown in FIG. 31.

In the comparative example, the repeater RPX inserted in the signal wire connecting the memory arrays MA1 and MS2 is formed in the vicinity of the main surface of the semiconductor substrate, similarly to the semiconductor elements included in the memory arrays MA1 and MA2. In this case, between the memory arrays MA1 and MA2 in which memory cells are regularly arranged in rows and columns, a region where the repeater RPX is to be formed needs to be provided. This reduces the integration density of the memory cells included in the memory arrays. Note that, since linear wires including the long-distance wire are disposed to be arranged over the memory arrays MA1 and MA2, it is difficult to lead out a part of the long-distance wire to the region outside the memory arrays MA1 and MA2 in plan view and form a MOSFET for the repeater RPX in the region outside the memory arrays MA1 and MA2.

Not only the repeater RPX interposed between the memory arrays MA1 and MA2, but also each of the other plurality of repeaters RPX shown in FIG. 32 needs to be formed in a dedicated formation region which is ensured in the main surface of the semiconductor substrate. That is, after the design change, it is necessary to provide the region where the MOSFET for timing correction is to be formed in the main surface of the semiconductor substrate. Accordingly, the miniaturization of the semiconductor chip CP becomes difficult so that the performance of the semiconductor device deteriorates.

By contrast, in the present embodiment, as shown in FIG. 19, the modules MDA and MDB are coupled to each other via the plugs PLG, the long-distance wires WR, and the repeater RP in the upper portion of the stacked wiring layers. The configuration of the modules MDA and MDB and the long-distance wires WR, the configuration of the plug PLG between the long-distance wire WR and the module MDA, and the configuration of the plug PLG between the long-distance wire WR and the module MDB are the same as in the comparative example described using FIG. 31. However, unlike in the comparative example, the repeater RP coupled between the two long-distance wires WR is formed not in the vicinity of the main surface of the semiconductor substrate SB, but in the upper portion of the stacked wiring layers.

The repeater RP is, e.g., the inverter INV described using, e.g., FIG. 15 and includes the wiring-layer MOSFETs shown in FIG. 14. That is, the input terminal shown in FIG. 15 is electrically coupled to the module MDA via the long-distance wire WR and the plug PLG in FIG. 19. On the other hand, the output terminal shown in FIG. 15 is electrically coupled to the module MDB via the long-distance wire WR and the plug PLG in FIG. 19. Note that the wire coupling the output terminal of the inverter INV to the module is preferably a wire having a sufficiently short length such that a signal delay presents no problem.

Accordingly, each of the gate electrodes G1 and G2 shown in FIG. 14 is coupled to one end portion of the long-distance wire WR (see FIG. 19). The other end portion of the long-distance wire WR is coupled to, e.g., the MOSFET Q1 included in the logic circuit.

Thus, in the present embodiment, the repeater RP including the wiring-layer MOSFETs is used. Accordingly, in the case where, after the semiconductor device having the structure in which the individual modules are coupled to each other with one long-distance wire is formed in Step S43 in FIG. 2, it is found that delay correction is needed in the inspection in Step S44, even when the repeater RP is added as a result of a design change (Step R20 in FIG. 2), the portion to be subjected to layout correction may appropriately be only the upper portion of the stacked wiring layers. That is, unlike in the comparative example shown in FIG. 31, there is no need to make a design change for forming the MOSFETs included in the repeater RPX in the vicinity of the main surface of the semiconductor substrate SB nor to change the layout of each of the wiring layers to provide a conductive path extending from the main surface of the semiconductor substrate SB to the upper portion of the stacked wiring layers. This can reduce the manufacturing cost of the semiconductor device.

In the present embodiment, photomasks which need to be corrected when the MOSFETs included in the repeater are added are, e.g., five photomasks shown below. That is, the photomask used to form the gate electrodes G1 and G2, the photomask used to process the semiconductor layer SCP, the photomask used to process the semiconductor layer SCN, the photomask used to form the wires WR2 to WR5, and the photomask used to form the vias V6. Note that the number of the photomasks which need to be corrected (re-designed and re-produced) to add the MOSFETs may be smaller or larger than 5.

Even when each of the transistors to be included in the repeater is formed, the steps of the manufacturing process of the semiconductor device to be added are only the two steps of processing the semiconductor layers SCP and SCN. This allows the repeater for timing correction to be inserted at extremely low cost.

When the number of the photomasks to be changed is thus small, an increase in manufacturing cost in a design change, which is the addition of the repeater, can more significantly be reduced than in the case where a layout change is performed for all the wiring layers spanning from the main surface of the semiconductor substrate SB to the upper portion of the stacked wiring layers as performed in the foregoing comparative example.

Also, by forming the repeater coupled to the long-distance wire using not the in-substrate MOSFETs, but the wiring-layer MOSFETs, the lengths of the plugs between the long-distance wire and the MOSFETs can be reduced. This can prevent an increase in resistance value resulting from an increase in the length of the wire and the occurrence of a further signal delay.

In the present embodiment, the repeater is formed in the upper portion of the wiring layers so that there is no need to provide the region where the repeater is to be formed in the main surface of the semiconductor substrate, unlike in the comparative example shown in FIG. 32. Consequently, when the repeater RP is inserted in the middle of the long-distance wire coupling, e.g., the memory arrays MA1 and MA2 shown in FIG. 16 to each other, there is no need to provide the region where the repeater RP is to be formed in the main surface of the semiconductor substrate located between the memory arrays MA1 and MA2. That is, even when the repeater RP is added as a result of a design change, there is no change in the layout of the elements formed in the vicinity of the main surface of the semiconductor substrate and there is no increase in chip area. In addition, since the memory arrays MA1 and MA2 need not be brought away from each other, it is possible to prevent a reduction in the integration density of the memory cells.

This facilitates the miniaturization of the semiconductor device as the semiconductor chip CP1 and can increase the degree of integration of the semiconductor device to allow an improvement in the performance of the semiconductor device.

Also, in the present embodiment, each of the gate insulating films of the first and second transistors QP and QN is formed only of the insulating film DP6. Accordingly, there is no difference between the respective film thicknesses of the gate insulating films of the first and second transistors QP and QN. As a result, it is possible to prevent variations in the characteristic of each of the first and second transistors QP and QN, such as the threshold voltage.

Figure 20:
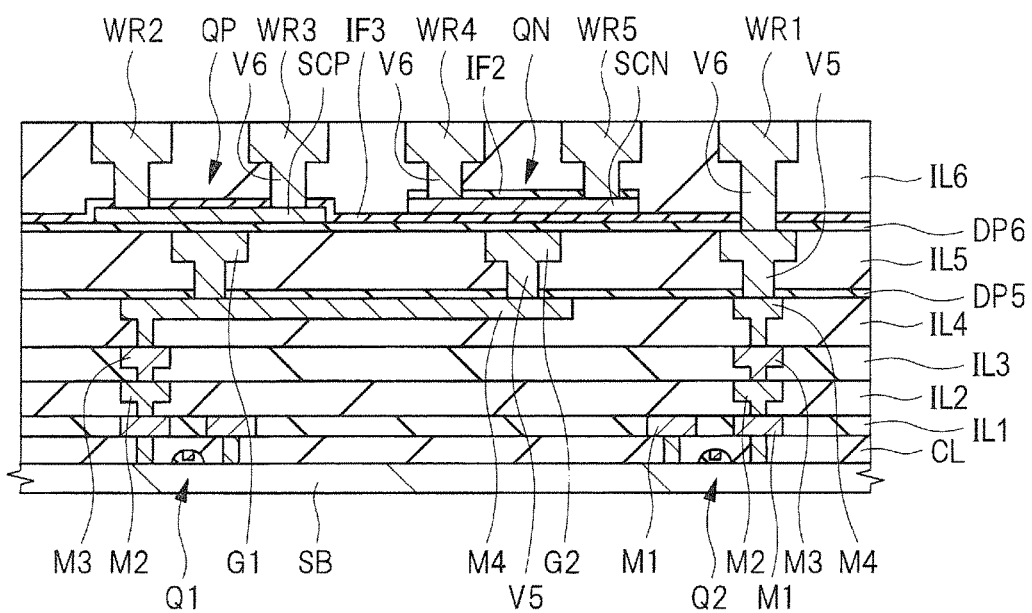
FIG. 20 is a cross-sectional view of a modification of the semiconductor device in Embodiment 1 of the present invention.

The following will describe a modification of the semiconductor device in the present embodiment using FIG. 20. FIG. 20 is a cross-sectional view showing the modification of the semiconductor device in the present embodiment. In the process described using FIGS. 7 to 11, the insulating film IF1 covers the upper portion of the semiconductor layer SCP to prevent the semiconductor layer SCP from being removed in the patterning step described using FIG. 11. Also, in the process described using FIGS. 9 to 11, the sidewalls SW cover the side walls of the semiconductor layer SCP to prevent parts of the semiconductor layer SCN (see FIG. 10) from remaining in contact with the side walls of the semiconductor layer SCP after the patterning step.

By contrast, it may also be possible to cover the semiconductor layer SCP with one insulating film IF3 and form the semiconductor layer CN over the insulating film IF3 in the same manner as in the modification shown in FIG. 20. In this case, in the manufacturing process of the semiconductor device, after the process described using FIG. 8, the insulating film IF3 made of a silicon dioxide film or the like is formed by, e.g., a CVD method to cover the semiconductor layer SCP. Then, by performing the process described using FIGS. 10 to 14, the semiconductor device in the present modification can be formed.

In the present modification, the sidewalls SW are not formed. Accordingly, the etching step performed to form the sidewalls SW can be omitted. This can reduce the manufacturing cost of the semiconductor device.

Embodiment 2

Figure 21:
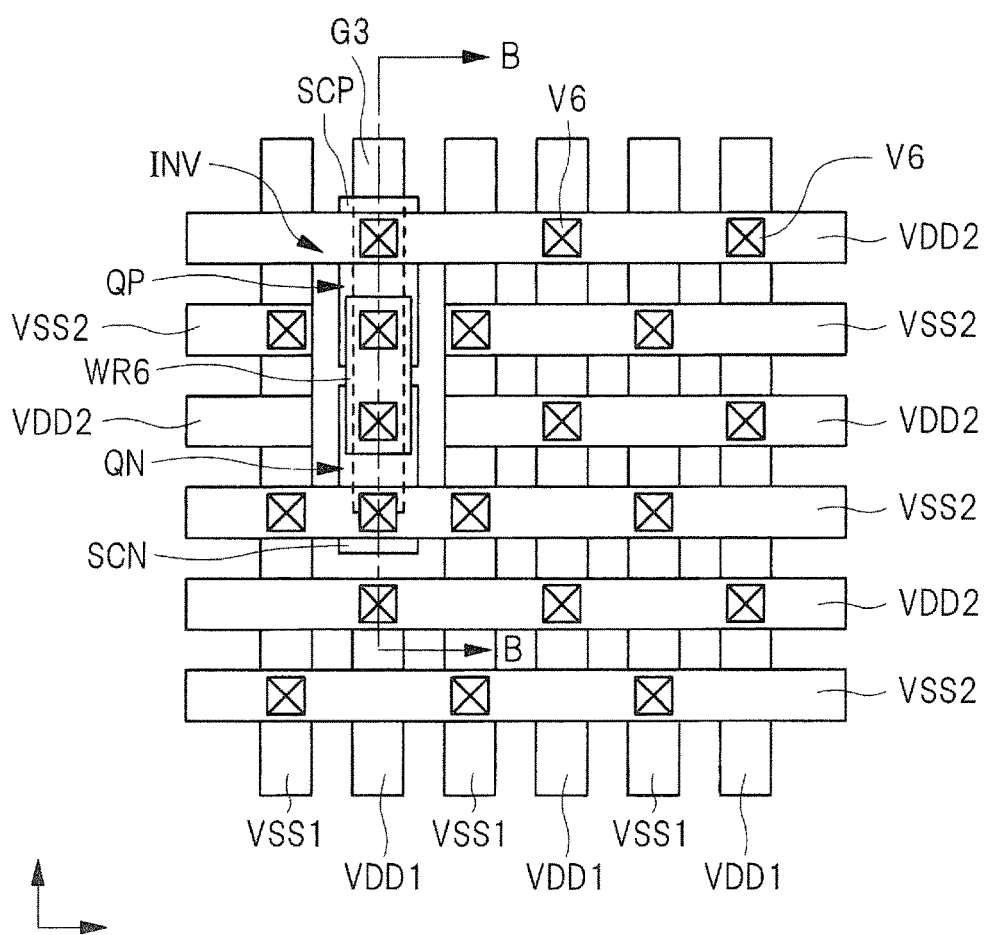
FIG. 21 is a plan view of a semiconductor device in Embodiment 2 of the present invention.
Figure 22:
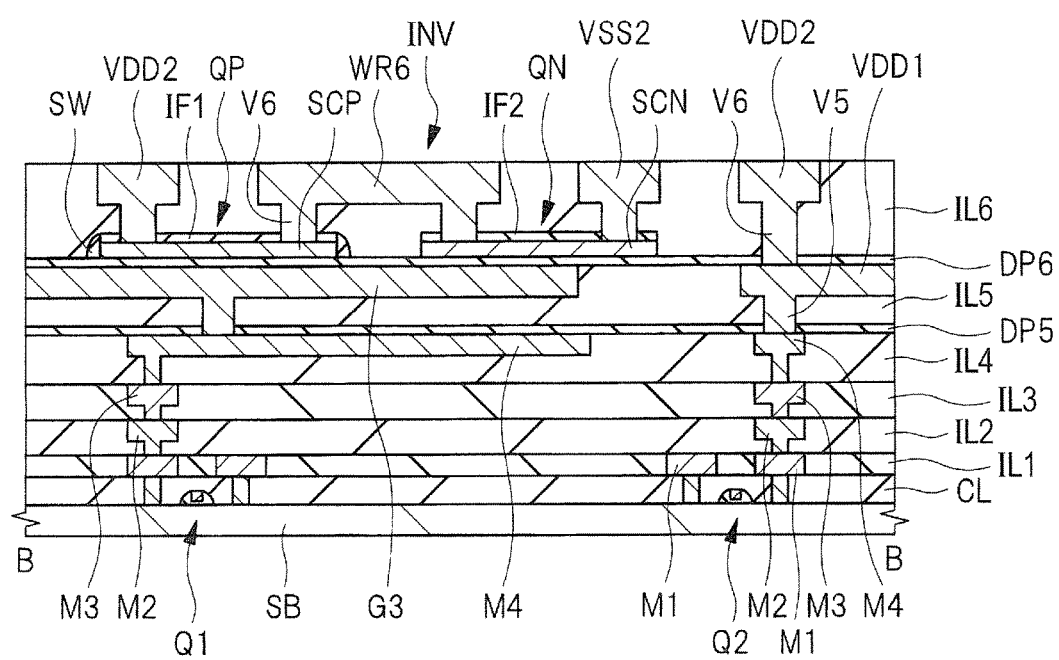
FIG. 22 is a cross-sectional view along the line B-B in FIG. 21.
Figure 23:
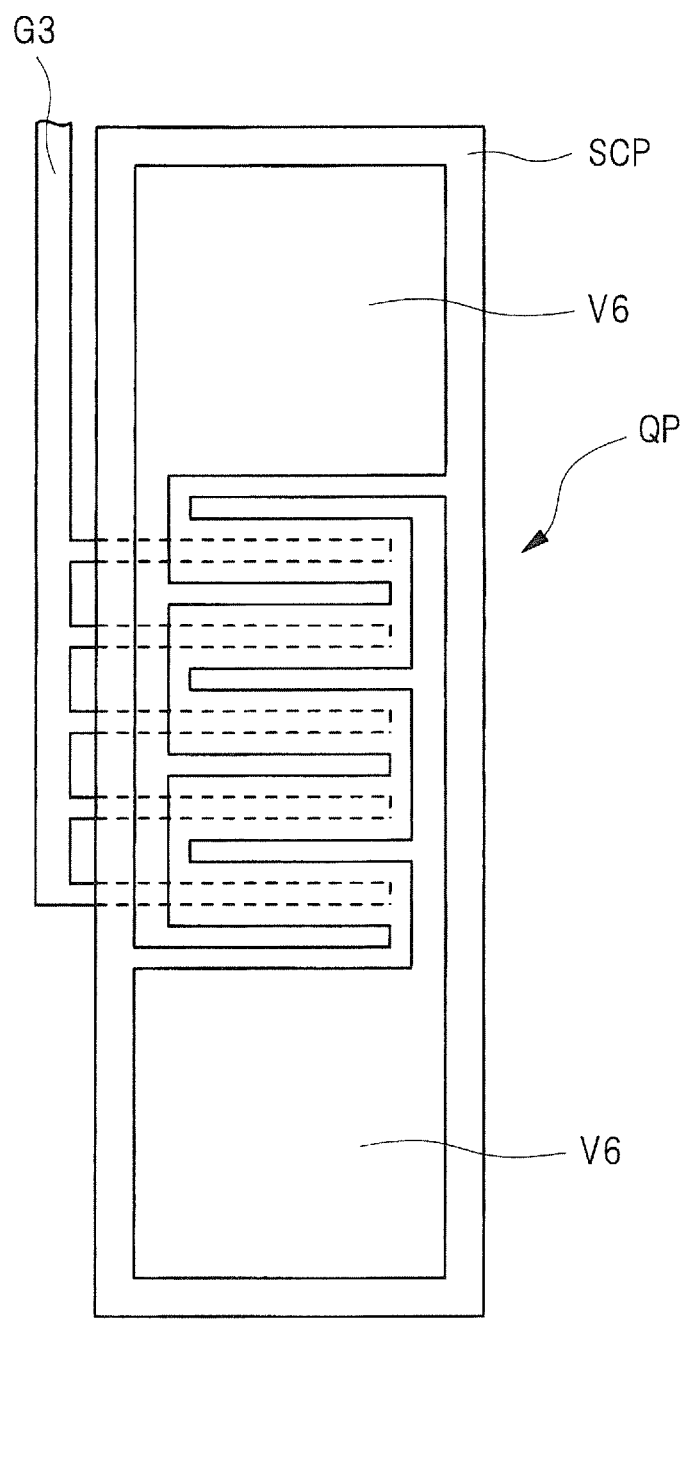
FIG. 23 is a plan view of the semiconductor device in Embodiment 2 of the present invention.
Figure 24:
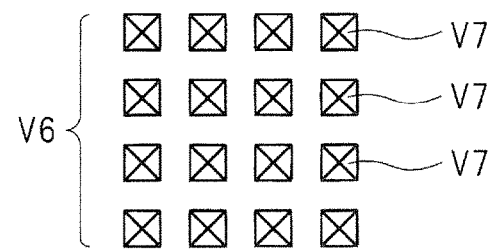
FIG. 24 is a plan view of the semiconductor device in Embodiment 2 of the present invention.

Next, a description will be given of Embodiment 2 using FIGS. 21 to 24. FIGS. 21, 23, and 24 are plan views each showing a part of the semiconductor device in the present embodiment. FIG. 22 is a cross-sectional view showing the semiconductor device in the present embodiment, which is a cross-sectional view along the line B-B in FIG. 21.

In the present embodiment, in the case where wires in a mesh structure are provided in the upper portion of the stacked wiring layers included in the semiconductor chip, the repeater is formed in a part of the wires arranged in a mesh configuration. The semiconductor device in the present embodiment has a layout different from that of the structure described above in Embodiment 1. The manufacturing process of the semiconductor device in the present embodiment is the same as in Embodiment 1 described above. Note that, in FIG. 21, the illustration of the side walls SW (see FIG. 22) is omitted. Also, in FIG. 21, the contour of the gate electrode G3 under each of a wire WR6 and the semiconductor layers SCP and SCN is shown by the broken line.

FIG. 21 shows each of the wires in the uppermost portion of the stacked wiring layers included in the semiconductor chip as the semiconductor device in the present embodiment and the wiring-layer MOSFETs. As shown in FIG. 21, each of wires VDD2 and VSS2 in the uppermost one of the stacked wiring layers extends in the second direction, while each of wires VDD1 and VSS1 included in the wiring layer immediately under that of the wires VSS2 and VDD2 extends in the first direction. The wires VDD1 and VSS1 are alternately arranged in the second direction, while the wires VDD2 and VSS2 are alternately arranged in the first direction. The plurality of wires VDD1 and VSS1 have respective parts overlapping the plurality of wires VDD2 and VSS2 at the portions crossing the plurality of wires VDD2 and VSS2 in plan view. That is, the wires VDD1, VSS1, VDD2, and VSS2 are arranged in a grid-like configuration in plan view.

Figure 33:
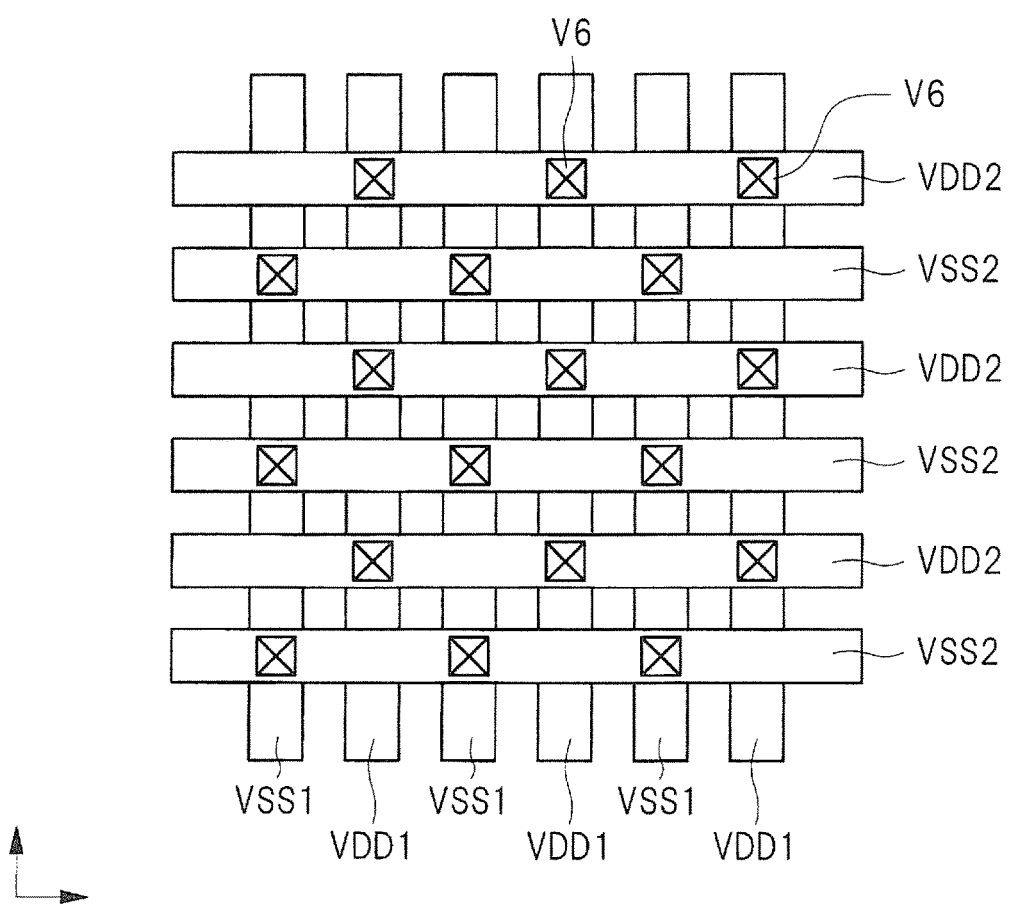
FIG. 33 is a plan view of the semiconductor device in the comparative example.

That is, the wires in the uppermost portion of the stacked wiring layers has a multilayer mesh structure. For example, the wires VDD1 and VSS1 are the wires in the uppermost one of the stacked wiring layers and the wires VDD2 and VSS2 are the wires in the pad layer located above the stacked wiring layers to form the pad electrodes. The wires VDD1 and VDD2 are used to apply (supply) a power supply voltage (power supply potential). The wires VSS1 and VSS2 are used to apply (supply) a ground voltage. Thus, as a power supply, power supply wires in the multilayer mesh structure may be used for the flexibility of wiring design as used in a comparative example shown in FIG. 33. The power supply wires in the mesh structure are formed over, e.g., the elements included in the logic circuit. FIG. 33 is a plan view showing power supply mesh wires in a semiconductor device in the comparative example. In FIG. 33, the lower-layer wires VDD1 and VSS1 and the upper-layer wires VDD2 and VSS2 are arranged in a grid-like configuration in plan view.

Note that the wires in the uppermost portion of the stacked wiring layers mentioned in the present application include the wires VDD1 and VSS1 in the uppermost one of the stacked wiring layers, the wires VDD2 and VSS2 located over the wires VDD1 and VSS1, and wires at the same height as that of these wires.

At the portions of the wires VDD1 and VDD2 crossing each other in plan view, the wires VDD1 and VDD2 are electrically coupled to each other via the vias V6. At the portions of the wires VSS1 and VSS2 crossing each other in plan view, the wires VSS1 and VSS2 are electrically coupled to each other via the vias V6. Consequently, the wires VDD1 and VDD2 are at the same potential and the wires VSS1 and VSS2 are at the same potential.

The predetermined one of the wires VDD1 has a broken portion and the gate electrode G3 extending in the first direction is formed at a position adjacent to the wire VDD1 in the extending direction (first direction) of the wire VDD1. The gate electrode G3 is interposed between the two wires VSS1 adjacent to each other in the second direction.

Each of the predetermined one of the wires VDD2 and the wire VSS2 adjacent to the wire VDD2 in the first direction have a broken portion immediately over the gate wire G3. In the region located immediately over the gate electrode G3 and adjacent to the broken portions of the wires VDD2 and VSS2 in the second direction, the wire WR6 is formed to extend in the first direction. The wire WR6 is interposed between the wires VDD2 and VSS2 in the first direction. That is, the wire WR6 is adjacent to the wires VDD2 and VSS2 in a direction along the main surface of the semiconductor substrate.

That is, as shown in FIGS. 21 and 22, the gate electrode G3 is a wire at the same height as that of each of the wires VDD1 and VSS1. In other words, the gate electrode G3 is included in the same wiring layer as including the wires VDD1 and VSS1 and can be formed in the same process as that of forming the wires VDD1 and VSS1. On the other hand, the wire WR6 is at the same height as that of each of the wires VDD2 and VSS2. That is, the wire WR6 is included in the same wiring layer as including the wires VDD2 and VSS2 and can be formed in the same process as that of forming the wires VDD2 and VSS2. Thus, the gate electrode G3 and the wires VDD1 and VSS1 are embedded in the interlayer insulating film IL5.

In the same manner as in Embodiment 1 described above, in the upper portion of the stacked wiring layers, the P-type first transistor QP having the semiconductor layer SCP as the channel layer and the N-type second transistor QN having the semiconductor layer SCN as the channel layer are formed.

However, unlike in Embodiment 1 described above, the first and second transistors QP and QN share the same gate electrode G3. The respective drain regions of the first and second transistors QP and QN are coupled to the same wire WR6 via the vias V6 formed over the semiconductor layers SCP and SCN. That is, the respective drain regions of the first and second transistors QP and QN are electrically coupled to each other. The source region of the first transistor QP is electrically coupled to the wire VDD2 via the via V6, while the source region of the second transistor QN is electrically coupled to the wire VSS2 via the via V6.

That is, the first and second transistors QP and QP are included in the inverter INV shown in FIG. 15. Specifically, the gate electrode G3 serves as the input terminal of the inverter INV, while the wire WR6 serves as the output terminal of the inverter INV. The wire WR6 is electrically led out via, e.g., the conductive path coupled to the upper surface thereof.

In the present embodiment, the inverter INV shown in each of FIGS. 21 and 22 forms the repeater inserted in the middle of the long-distance wire. Thus, it is possible to incorporate the first and second transistors QP and QN which are included in the repeater into the power supply mesh wires.

Note that the inverter INV may also be employed for use other than in the repeater. In other words, the input terminal or output terminal of the inverter INV need not necessarily be coupled to the long-distance wire. For example, it may also be possible to couple the input terminal or the output terminal to a device outside the semiconductor chip and use the inverter INV for the I/O. The inverter in the present embodiment can also be used as a part of such a logic circuit as will be described later in Embodiment 3.

The inverter INV is an element which needs a supply of a power supply voltage Vdd to the source region of the first transistor QP and a supply of the ground potential to the source region of the second transistor QN. In the present embodiment, by incorporating the inverter INV into the mesh wires which supply the power supply voltage and the ground potential, it is possible to dispose the inverter INV without routing a voltage supply path using wires, vias, and the like. In addition, in the region where the power supply mesh wires are formed, the inverter INV can be formed not in the region below the power supply mesh wires, but in the uppermost portion of the stacked wiring layers, similarly to the power supply mesh wires. This can reduce the number of photomasks which need a design change and reduce the manufacturing cost when the inverter INV is additionally formed.

In the present embodiment, the same effect as obtained in Embodiment 1 described above can also be obtained. In addition, since the widths of the wires VDD1 and VSS1 as the wires in the uppermost one of the stacked wiring layers are, e.g., 8 to 10 μm and relatively large and the widths of the wires VDD2 and VSS2 as pad wires are, e.g., 10 to 15 μm and relatively large, design rules are eased in these wiring layers. That is, the size of the pattern formed in the uppermost portion of the stacked wiring layers is large. As a result, the following effect can be obtained.

That is, by forming the inverter INV in the uppermost portion of the stacked wiring layers, the formation of the inverter INV can be facilitated. In addition, the effect of allowing easy introduction of a new material as a material for the semiconductor layers SCP and SCN can also be obtained. Moreover, since it is possible to increase the widths of the semiconductor layers SCP and SCN as the channel layers, the parasitic resistance occurring in the inverter INV can be reduced. Furthermore, since i-line masks can also be used as photomasks used to process the semiconductor layers SCP and SCN as the channel layers, the photomasks can be produced at low cost.

The i-line mask is a photomask used in the photolithographic step performed when processing for the pad electrodes is performed. The i-line is light used for exposure in the photolithographic step. Since the width and pitch of the pattern of the pad electrodes are large, high accuracy is not required of the processing for the pad electrodes. Accordingly, at the time of the processing, the i-line mask that can be used at low cost is used.

Note that, in FIGS. 21 and 22, each of the gate electrode G3 and the semiconductor layers SCP and SCN is shown in a pattern extending in the first direction and the rectangular vias V6 coupled individually to the semiconductor layers SCP and SCN are shown. However, it may be difficult to allow a large current to flow using only one transistor. In view of this, to allow a large current to flow by forming a plurality of transistors in a given range, each of the gate electrode, the source region, and the drain region which are included in each of the transistors may also have a comb-shaped two-dimensional layout, as shown in FIG. 23. In FIG. 23, the first transistor QP is shown and the gate electrode G3 under the vias V6 and the semiconductor layer SCP is shown by the broken line.

As shown in FIG. 23, the gate electrode G3 has a portion extending in the first direction and a plurality of portions (fingers) branched from the portion to extend one way in the second direction. The semiconductor layer SCP extends in the first direction and the width thereof in the second direction is, e.g., 10 μm or more. The two-dimensional shape of each of the two vias V6 coupled to the upper surface of the semiconductor layer SCP is not a simple rectangle. One of the two vias V6 has, immediately over the semiconductor layer SCP, a rectangular portion in plan view, a portion extending from the rectangular portion toward the other via V6 in the first direction in plan view, and a plurality of portions (fingers) branched from the extending portion to extend in the second direction in plan view. The other via V6 also has the same structure.

The respective fingers of the two vias V6 are located to be alternately arranged in the first direction. Immediately under the region between each of the fingers of one of the vias V6 and the finger of the other via V6 adjacent thereto in the first direction, one of the foregoing fingers of the gate electrode G3 is located. The two vias B6 are not in contact with each other.

In the first transistor as a junctionless FET, the source region is formed in the upper surface of the semiconductor layer SCP immediately under one of the foregoing two vias V6 and the drain region is formed in the upper layer of the semiconductor layer SCP immediately under the other via V6. In the layout shown in FIG. 23, each of the fingers of the gate electrode GE arranged in the first direction in plan view and the source/drain regions immediately under the respective fingers of the two vias which are located such that the gate electrode G3 is interposed therebetween are included in one transistor. That is, the comb-shaped first transistor QP includes the plurality of transistors arranged in the first direction.

By thus using the comb-shaped transistor, it is possible to gain an effective electric power. Since the wires VDD1, VDD2, VSS1, and VSS2 in the uppermost portion of the wiring layers have large wire widths, it is easy to form the first transistor QP in a pattern in which the width of the source region, the drain region, or the gate electrode G3 is not more than 1 μm in the same manner as in the case of forming the first transistor QP in FIG. 23 which is incorporated into the mesh wires. Note that the second transistor QN can also have the same layout as that of the first transistor QP shown in FIG. 23.

In FIGS. 21 and 22, each of the vias V6 is shown in one rectangular shape. However, as shown in FIG. 24, the via V6 coupling predetermined wires to each other may also include a plurality of vias V7 arranged in, e.g., rows and columns in plan view.

Each of the wires BDD1 and BDD2 is broken in the middle thereof due to the presence of the wire WR6 and the gate electrode G3. However, since the wires VDD1 and VDD2 formed in the grid-like configuration are coupled to each other at the plurality of portions thereof via the vias V6, there is no interruption of the supply of the potential in the mesh wires due to the broken portions of the wires VDD1 and VDD2. Likewise, the wire VSS2 is broken in the middle thereof due to the presence of the wire WR6, but there is no interruption of the supply of the ground potential in the mesh wires.

Figure 25:
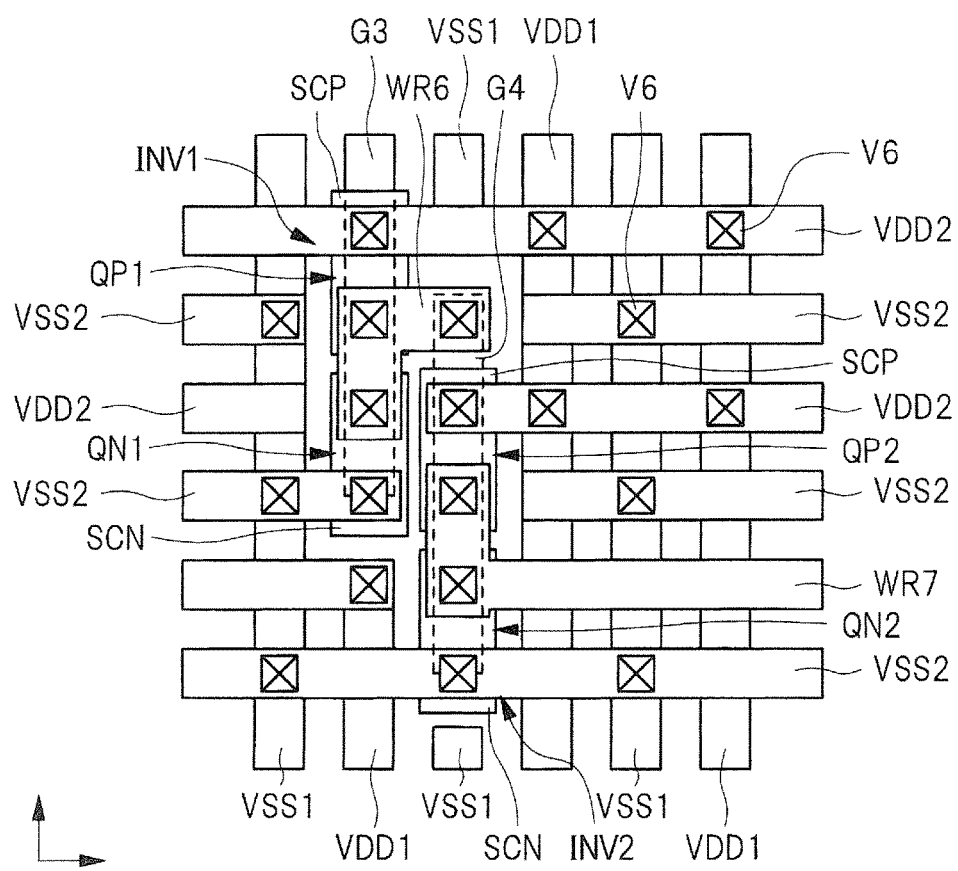
FIG. 25 is a plan view showing a modification of the semiconductor device in Embodiment 2 of the present invention.
Figure 26:
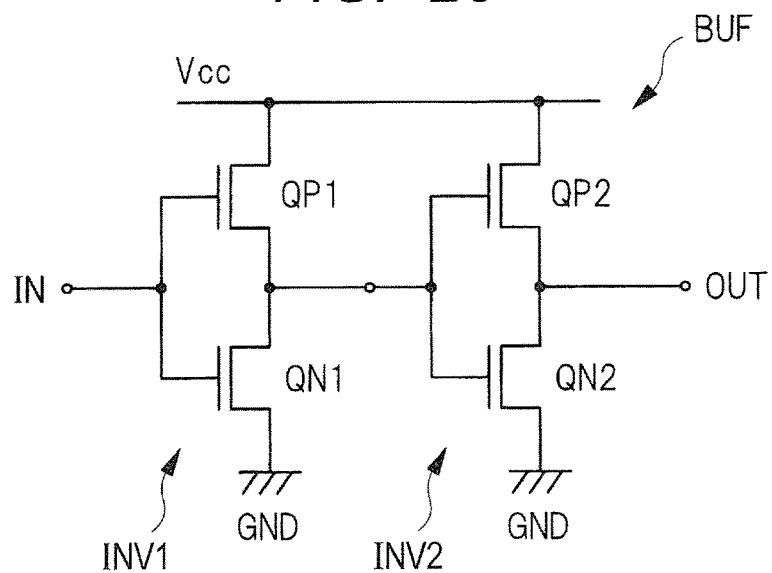
FIG. 26 is a circuit diagram showing the buffer included in the modification of the semiconductor device in Embodiment 1 of the present invention.

The following will describe a modification of the present embodiment using FIGS. 25 and 26. FIG. 25 is a plan view showing a part of a semiconductor device in the modification of the present embodiment. FIG. 26 is a circuit diagram showing the buffer included in the semiconductor device in the modification of the present embodiment.

In the mesh wires shown in FIG. 25, some of the wires VDD2 and VSS2 are broken in the middle thereof, similarly to the mesh wires shown in FIG. 21. Also, one of the wires BDD1 is broken in the middle thereof and the gate electrode G3 is formed at a position adjacent to the wire VDD1 in the first direction, and an inverter INV1 including a first transistor QP1 and a second transistor QN1 each including the gate electrode G3 is formed. The inverter INV1 has the same structure as that of the inverter INV shown in FIG. 21.

However, the wire WR6 as the output terminal of the inverter INV1 has a portion extending in the second direction. On the other hand, one of the wires VSS1 adjacent to the gate electrode G3 in the second direction is broken in the middle thereof. Between the broken portions of the wire VSS1 which are adjacent to each other in the first direction, a gate electrode G4 having the same height as that of the wire VSS1 is formed. Immediately over the gate electrode G4, an inverter INV2 having the same structure as that of the inverter INV1 is formed.

That is, immediately over the gate electrode G4, the semiconductor layers SCP and SCN adjacent to each other in the first direction are disposed. The respective drain regions of a third transistor QP2 including the gate electrode G4 and the semiconductor layer SCP and a fourth transistor QN2 including the gate electrode G4 and the semiconductor layer SCN are electrically coupled to each other via the vias V6 and a wire WR7 which are located over the semiconductor layers SCP and SCN. Similarly to the gate electrode G3, the gate electrode G4 is embedded in the interlayer insulating film IL5.

To the gate electrode G4 as the input terminal of the inverter INV2, the portion of the wire WR6 as the output terminal of the inverter INV1 which extends in the second direction is electrically coupled via the via V6. To the upper surface of the semiconductor layer SCP as the source region of the third transistor QP2, the wires VDD2 are electrically coupled via the vias V6. To the upper surface of the semiconductor layer SCN as the source region of the fourth transistor QN2, the wires VSS2 are electrically coupled via the vias V6. The wire WR7 as the output terminal of the inverter INV2 has a portion extending in the first direction immediately over the gate electrode G4 and another portion extending in the second direction. The portion of the wire WR7 which extends in the second direction is disposed between the wires VSS2 adjacent to each other in the first direction.

The inverters INV1 and INV2 are included in the buffer BUF shown in FIG. 26. That is, the output terminal of the inverter INV1 is coupled to the input terminal of the inverter INV2. In other words, the respective drain electrodes of the first and second transistors QP1 and QN1 included in the inverter INV1 are coupled to the respective gate electrodes of the third and fourth transistors QP2 and QN2 included in the inverter INV2. The buffer BUF is included in the repeater in the present modification. That is, the buffer BUF is the element inserted in the middle of the long-distance wire.

In the present modification, the buffer BUF including the MOSFET in the upper portion of the stacked wiring layers is used as the repeater to achieve a delay reduction (timing adjustment). Since the buffer BUF is used as the repeater, it is possible to more reliably prevent the inversion of the output value of the signal than in the case where only one inverter INV is used as the repeater, as shown in FIG. 21. That is, the signal in which a delay has occurred flows through the inverter INV1 shown in FIG. 26 and, consequently, the signal waveform thereof is improved and the output value thereof is inverted. However, the signal subsequently flows through the inverter INV2 so that the output value of the signal is inverted again.

Thus, it is possible to prevent the respective outputs of the signal input to the buffer BUF and the signal output therefrom from being inverted. This eliminates the need to give consideration to the inversion of the outputs resulting from the provision of the repeater. Accordingly, it is possible to obtain the effect of allowing easy design of a circuit and also obtain the same effect as the effect described using FIGS. 21 to 24 in the present modification.

Embodiment 3

The following will describe a semiconductor device in Embodiment 3 using FIGS. 27 to 30. FIGS. 27 to 30 are circuit diagrams each showing the semiconductor device in the present embodiment.

In the present embodiment, in the upper portion of a semiconductor chip as the inspection semiconductor device, preparatory cells used for logic correction are disposed in advance. In the manufacturing process of the semiconductor device, when a circuit such as a logic circuit in the semiconductor chip is operated on a trial basis after the semiconductor chip is manufactured, a logic bug or the like may be found in the circuit. When the logic bug is found, it may be necessary to, e.g., invert a signal. To prevent this, the preparatory cells which are the elements formed in advance during the foregoing manufacturing and are not included in the circuit are coupled to the circuit as a result of a design change made after the foregoing trial operation to thus correct the logic bug.

In other words, when the inspection semiconductor device including the logic circuit and the preparatory cells not included in the circuit is formed and then the logic bug is found in the logic circuit by performing inspection, the design change is made. In accordance with the design change, the semiconductor device in the present embodiment having a structure in which the logic circuit is electrically coupled to the preparatory cells is formed.

Examples of the preparatory cells include fundamental cells such as the inverter (see FIG. 15), the buffer (see FIG.

Figure 30:
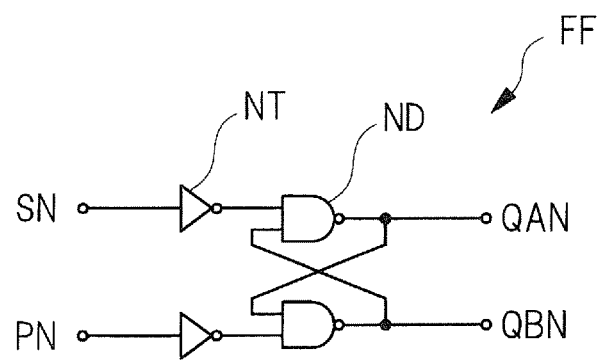
FIG. 30 is a circuit diagram showing the semiconductor device in Embodiment 1 of the present invention.

26), the NAND (see FIG. 27), the NOR (see FIG. 28), a multiplexer (see FIG. 28), and the flip-flop (see FIG. 30). In the present embodiment, as the MOSFETs included in these preparatory cells, the wiring-layer MOSFETs shown in FIGS. 13 and 14 are used. For example, the wiring-layer MOSFETs are used as the first and second transistors QP and QN included in the inverter INV shown in FIG. 15 and as the first, third, and fourth transistors QP1, QP2, and QN2 included in the buffer BUF shown in FIG. 26.

Figure 27:
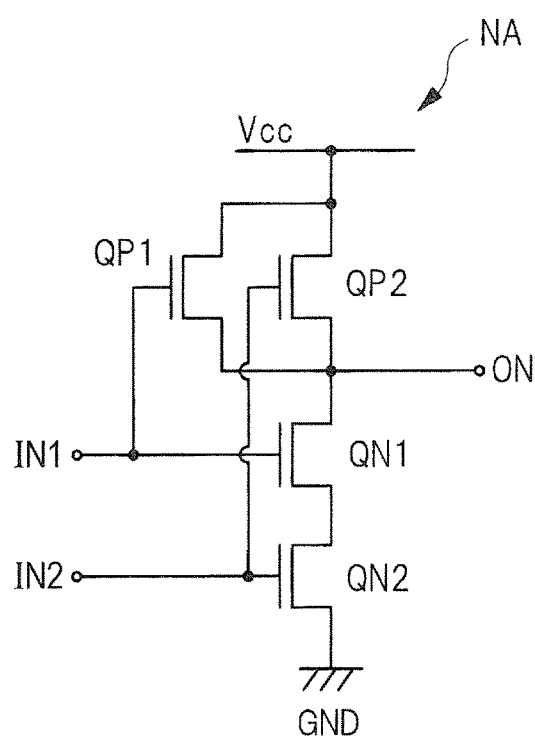
FIG. 27 is a circuit diagram showing the semiconductor device in Embodiment 1 of the present invention.
Figure 28:
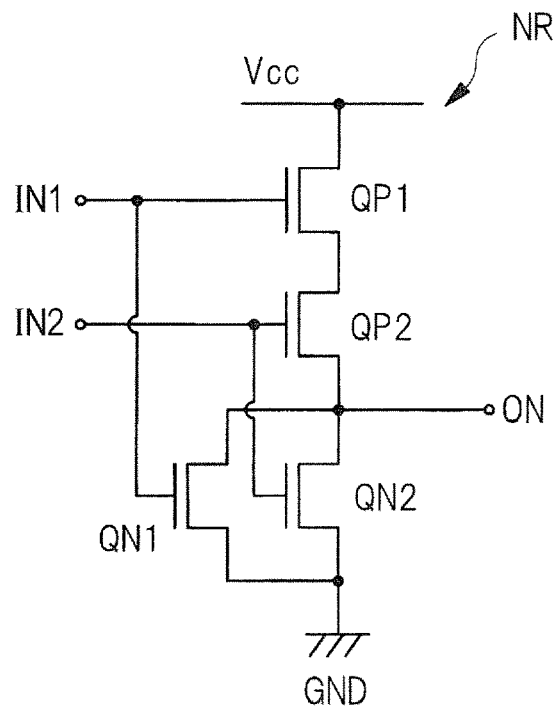
FIG. 28 is a circuit diagram showing the semiconductor device in Embodiment 1 of the present invention.

The wiring-layer MOSFETs are used also as the first, third, and fourth transistors QP1, QP2, and QN2 of a NAND circuit NA shown in FIG. 27 or a NOR circuit NR shown in FIG. 28. The wiring-layer MOSFET is used also as the transistor used in a NOT circuit NT, i.e., inverter circuit (see FIG. 15), an AND circuit AD, or an OR circuit OR included in a multiplexer MUX shown in FIG. 29. The wiring-layer MOSFET is used also as the NOT circuit NT, i.e., inverter circuit (see FIG. 15) or a NAND circuit ND included in a flip-flop circuit FF shown in FIG. 30.

Figure 29:
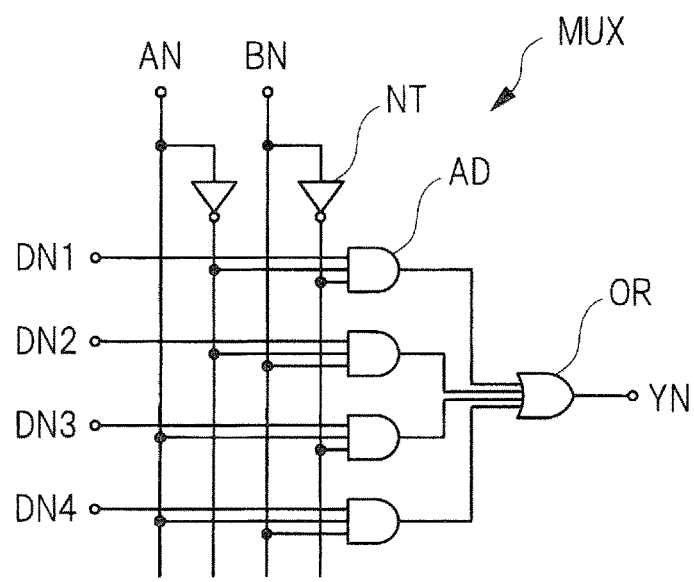
FIG. 29 is a circuit diagram showing the semiconductor device in Embodiment 1 of the present invention.

Note that nodes IN1 and IN2 in FIGS. 27 and 28 are input terminals and a node ON is an output terminal. Also, nodes DN1 to DN4 in FIG. 29 and nodes SN and PN in FIG. 30 are input terminals. Also, a node YN in FIG. 29 and nodes QAN and QBN in FIG. 30 are output nodes. Also, nodes AN and BN in FIG. 29 are terminals to which a selection signal is input.

The number of the preparatory cells is about 1% of the total number of the cells in the semiconductor chip. When the preparatory cells are formed in the vicinity of the main surface of the semiconductor substrate, the large number of preparatory cells are evenly distributed in a cell placement region in the semiconductor chip. In such a case, when a change such that the preparatory cells are coupled to the circuit is made to correct the logic bug, it is necessary to form contacts for coupling the wires in the uppermost layer to the elements in the vicinity of the main surface of the semiconductor substrate, as has been described using FIG. 31. As a result, the problem of an increase in the manufacturing cost of the semiconductor device arises.

In addition, by providing the preparatory cells in the vicinity of the main surface of the semiconductor substrate, the problem of an increase in the area of the semiconductor chip also arises. Conversely, when the number of the preparatory cells is reduced to prevent an increase in the area of the semiconductor chip, there may be a case where the intended preparatory cell is absent from a place which needs reconnection as anti-logic-bug measures.

Accordingly, in the present embodiment, the MOSFETs included in the logic correction preparatory cells are formed in advance in the upper portion of the wiring layers, not in the vicinity of the main surface of the semiconductor substrate. That is, the preparatory cells include the wiring layer MOSFETs described above in Embodiment 1. When the logic bug is found as a result of the inspection, the layout of the wires over the preparatory cells is changed and then the semiconductor chip is formed again. Thus, the preparatory cells are coupled to the circuit and the correction of the bug is performed.

In this case, in the manufacturing process of the semiconductor device, unlike in the case of forming the preparatory cells in the vicinity of the main surface of the semiconductor substrate, two photomasks need to be added to form the semiconductor layers SCP and SCN (see FIGS. 7 and 14) by processing. However, the layer to be subjected to a design change for the coupling of the preparatory cells may appropriately be only the wiring layer (i.e., the layer including, e.g., the power supply wire) over the preparatory cells including the wiring-layer MOSFETs. Accordingly, when a change such that the preparatory cells are coupled to the circuit is made to correct the logic bug, as has been described using FIGS. 19 and 31, the contacts for coupling the wires in the uppermost layer to the elements in the vicinity of the main surface of the semiconductor substrate need not be formed.

That is, when the preparatory cells are coupled to the circuit, a layout change for all the wiring layers need not be made. Accordingly, the number of the wiring layers to be subjected to the layout change can significantly be reduced compared to the case where the MOSFETs included in the preparatory cells or the like are formed in advance in the vicinity of the main surface of the semiconductor substrate and the preparatory cells are coupled to the circuit when the logic bug is corrected. This can reduce the manufacturing cost of the semiconductor device.

In addition, since there is no need to form the preparatory cells corresponding to about 1% of the total number of the cells in the vicinity of the main surface of the semiconductor substrate and the preparatory cells can be formed in the upper portion of the stacked wiring layers, the area of the semiconductor chip can be reduced. By thus forming the preparatory cells of the wiring-layer MOSFETs, the semiconductor device can be miniaturized in either of the cases where logic correction is necessary and where logic correction is unnecessary.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:
1. A semiconductor device, comprising:
a first semiconductor substrate;
a first semiconductor element formed over a main surface of the first semiconductor substrate;
a first interlayer insulating film formed over the first semiconductor element;
a first gate electrode formed over the first semiconductor element;
a second gate electrode formed over the first semiconductor element, the first and second gate electrodes being embedded in the first interlayer insulating film;
a first gate insulating film formed over the first gate electrode;
a second gate insulating film formed over the second gate electrode;
a first semiconductor layer disposed immediately over the first gate electrode via the first gate insulating film;
a second semiconductor layer disposed immediately over the second gate electrode via the second gate insulating film;
a first insulating film formed to cover the first and second semiconductor layers;
a first source region formed in an upper surface of the first semiconductor layer;
a first drain region formed in an upper surface of the first semiconductor layer;
a second source region formed in an upper surface of the second semiconductor layer;
a second drain region formed in an upper surface of the second semiconductor layer; and a plurality of vias coupled individually to the first source region, the first drain region, the second source region, and the second drain region;
wherein the first gate electrode, the first source region, and the first drain region are included in a first transistor having a first conductivity type,
wherein the second gate electrode, the second source region, and the second drain region are included in a second transistor having a second conductivity type different from the first conductivity type,
wherein the first and second gate electrodes are electrically coupled to each other,
wherein the first and second drain regions are electrically coupled to each other,
wherein a first inverter including the first and second transistors is used as a repeater circuit,
wherein the first interlayer insulating film, the first gate electrode extend in a first direction along a main surface of the first semiconductor substrate, the second gate electrode extend in the first direction, a plurality of first wires are embedded in the first interlayer insulating film and extend in the first direction, and a plurality of second wires are embedded in the first interlayer insulating film and extend in the first direction are formed,
wherein a plurality of third wires extend in a second direction orthogonal to the first direction over the vias, a plurality of fourth wires extend in the second direction over the vias, and a plurality of fifth wires over the vias are formed,
wherein the first wires and the second wires are placed to be alternately arranged in the second direction, while the third wires and the fourth wires are placed to be alternately arranged in the first direction,
wherein the first and second gate electrodes are disposed between the second wires adjacent to each other in the second direction, the first source region is electrically coupled to the third wires, and the second source region is electrically coupled to the fourth wires,
wherein the first and second drain regions are electrically coupled to the fifth wire,
wherein, to the first and third wires, a power supply potential is applied and, to the second and fourth wires, a ground potential is applied,
wherein the first interlayer insulating film, the first gate electrode, the second gate electrode, the first wires, the second wires, a third gate electrode are embedded in the first interlayer insulating film and extend in the first direction, and a fourth gate electrode embedded in the first interlayer insulating film and extending in the first direction are formed,
wherein the first semiconductor layer, the second semiconductor layer, a third semiconductor layer located immediately over the third gate electrode via a third gate insulating film, and a fourth semiconductor layer located immediately over the fourth gate electrode via a fourth gate insulating film are formed,
wherein the first insulating film covering the first, second, third, and fourth semiconductor layers is formed,
wherein the first source region, the first drain region, the second source region, and the second drain region are formed, a third source region and a third drain region are formed in an upper surface of the third semiconductor layer, and a fourth source region and a fourth drain region are formed in an upper surface of the fourth semiconductor layer,
wherein the vias coupled individually to the first source region, the first drain region, the second source region, the second drain region, the third source region, the third drain region, the fourth source region, and the fourth drain region and a sixth wire over the vias are formed,
wherein the third gate electrode, the third source region, and the third drain region are included in a third transistor having the first conductivity type,
wherein the fourth gate electrode, the fourth source region, and the fourth drain region are included in a fourth transistor having the second conductivity type,
wherein the third and fourth gate electrodes are disposed between the first wires adjacent to each other in the second direction, the third source region is electrically coupled to the third wires, and the fourth source region is electrically coupled to the fourth wires,
wherein the third and fourth drain regions are electrically coupled to each other,
wherein the first drain region, the second drain region, the third gate electrode, and the fourth gate electrode are electrically coupled to the sixth wire, and
wherein the first inverter, and a second inverter including the third and fourth transistors are included in a buffer used as the repeater circuit.

2. The semiconductor device according to claim 1, further comprising:
a second semiconductor element formed over a second semiconductor substrate;
a second interlayer insulating film formed over the second semiconductor element;
a first signal wire formed over the second interlayer insulating film, and a first circuit including the second semiconductor element and the first signal wire;
a second signal wire electrically formed to couple the first and second gate electrodes to the first semiconductor element; and
wherein the first semiconductor element, the second signal wire, and the repeater circuit are included in a second circuit.

3. The semiconductor device according to claim 1,
wherein an output terminal of the first inverter is coupled to an input terminal of another first inverter, and
wherein the two first inverters are included in the buffer used as the repeater circuit.

* * * * *